(12) United States Patent
Gotkis et al.

(10) Patent No.: US 7,166,015 B2
(45) Date of Patent: Jan. 23, 2007

(54) APPARATUS AND METHOD FOR CONTROLLING FLUID MATERIAL COMPOSITION ON A POLISHING PAD

(75) Inventors: Yehiel Gotkis, Fremont, CA (US); Danny Lim, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 96 days.

(21) Appl. No.: 10/741,933

(22) Filed: Dec. 19, 2003

(65) Prior Publication Data
US 2004/0219867 A1 Nov. 4, 2004

Related U.S. Application Data

(63) Continuation-in-part of application No. 10/674,373, filed on Sep. 29, 2003, which is a continuation-in-part of application No. 10/463,525, filed on Jun. 18, 2003, which is a continuation-in-part of application No. 10/186,472, filed on Jun. 28, 2002.

(51) Int. Cl.
*B24B 49/00* (2006.01)
*B24B 51/00* (2006.01)
*B24B 1/00* (2006.01)
*B24B 7/00* (2006.01)

(52) U.S. Cl. ................ 451/8; 451/41; 451/56; 451/287; 451/443; 451/444

(58) Field of Classification Search .............. 451/5, 451/8, 41, 56, 285–289, 443, 444
See application file for complete search history.

(56) References Cited

U.S. PATENT DOCUMENTS 5,762,536 A * 6/1998 Pant et al. ................. 451/6
6,257,953 B1 * 7/2001 Gitis et al. ................. 451/5
6,626,743 B1 * 9/2003 Boyd ......................... 451/56
6,835,116 B2 * 12/2004 Oguri et al. ............... 451/8
6,884,146 B2 * 4/2005 Lehman et al. ............ 451/5
2002/0037681 A1 * 3/2002 Gitis et al. ................. 451/5
2002/0037682 A1 3/2002 Takashita .................. 451/36

FOREIGN PATENT DOCUMENTS

JP  2002-273651  9/2002
JP  2002273651   9/2002

OTHER PUBLICATIONS

IBM Technical Disclosure Bulletin, Mar. 1994, US "Water/Air Brush for Wafer Chem-Mech Polishing".*

* cited by examiner

*Primary Examiner*—M. Rachuba
(74) *Attorney, Agent, or Firm*—Martine Penilla & Gencarella, LLP

(57) ABSTRACT

An apparatus for use in a chemical mechanical planarization system is provided. The apparatus includes a fluid displacing device and a fluid delivery device. The fluid displacing device is capable of being positioned at a proximate location over a polishing pad, the fluid displacing device configured to displace at least part of a first fluid from a region of the polishing pad. The fluid delivery device is capable of replacing the displaced first fluid with a second fluid at the region of the polishing pad, the second fluid being different than the first fluid. A method of controlling properties of a film present over a polishing pad surface is also provided.

23 Claims, 17 Drawing Sheets

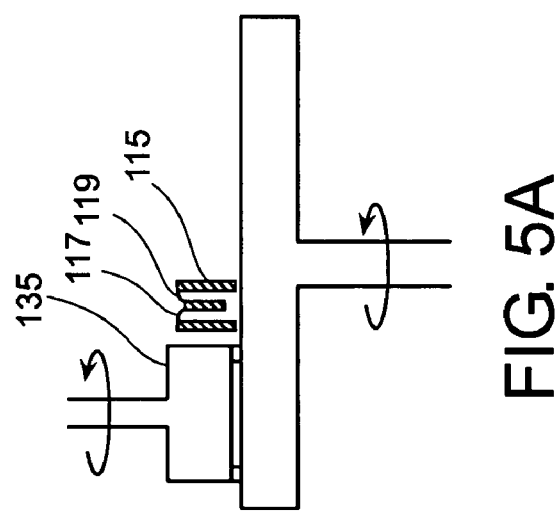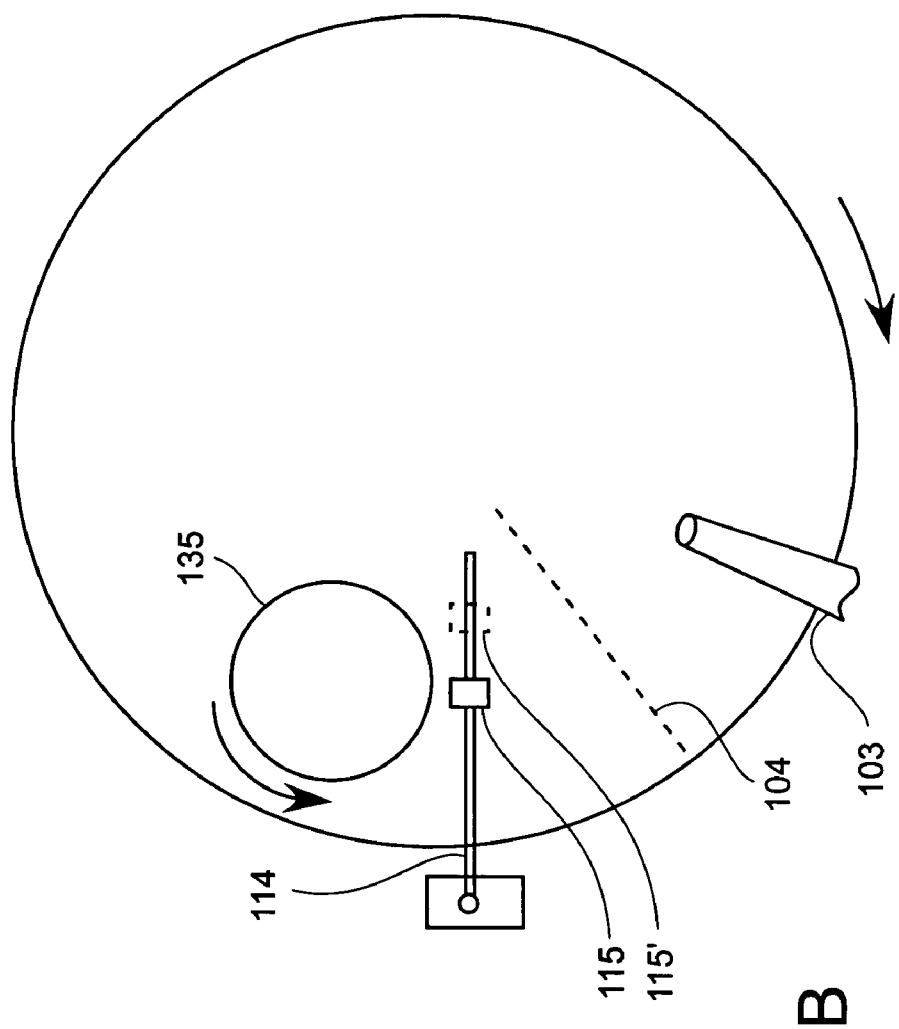

APPARATUS AND METHOD FOR CONTROLLING FLUID MATERIAL COMPOSITION ON A POLISHING PAD

CROSS REFERENCE TO RELATED APPLICATIONS

This application claims priority as a continuation-in-part of U.S. patent application Ser. No. 10/674,373, entitled "APPARATUS AND METHOD FOR CONTROLLING FILM THICKNESS IN A CHEMICAL MECHANICAL PLANARIZATION SYSTEM," filed on Sep. 29, 2003, which is continuation-in-part of U.S. patent application Ser. No. 10/463,525, entitled "METHOD AND APPARATUS FOR APPLYING DIFFERENTIAL REMOVAL RATES TO A SURFACE OF A SUBSTRATE," filed on Jun. 18, 2003, which is a continuation in part of U.S. patent application Ser. No. 10/186,472, entitled "INTEGRATION OF EDDY CURRENT SENSOR BASED METROLOGY WITH SEMICONDUCTOR FABRICATION TOOLS," filed on Jun. 28, 2002. The disclosure of these Patent Applications are incorporated herein by reference.

BACKGROUND OF THE INVENTION

1. Field of the Invention

The invention relates generally to semiconductor fabrication and more specifically to process control during chemical mechanical planarization (CMP) wafer processing.

2. Description of the Related Art

In the fabrication of semiconductor devices, there is a need to perform Chemical Mechanical Planarization (CMP) operations, including removal of the excessive material, buffing and post-CMP wafer cleaning and drying. Typically, integrated circuit devices are manufactured in the form of multi-level structures. At the substrate level, transistor devices having p-type and n-type doped regions are formed. In subsequent levels, interconnect metallization lines are patterned and electrically connected to the transistor devices to define the desired functional device. Patterned conductive features are insulated by dielectric materials, such as silicon dioxide. As more metallization levels and associated dielectric layers are formed, the need to planarize the dielectric material increases. Without planarization, fabrication of additional metallization layers becomes substantially impossible due to variations in the surface topography. In other applications, metallization line patterns are formed in the dielectric material, and then metal CMP operations are performed to remove excess metallization. Further applications include planarization of dielectric films deposited prior to the metallization process, such as dielectrics used for shallow trench isolation of for poly-metal insulation.

Typically CMP systems implement a rotary table, belt, orbital or brush operation in which belts, pads, or brushes are used to scrub, buff, and polish one or both sides of wafer. The pad itself is typically made of polyurethane material or other suitable material and may be backed by a rigid table, supporting belt, for example a stainless steel belt. In operation a slurry liquid is applied to and spread across the surface of the polishing pad or belt. As the belt or pad covered with slurry rotates, a wafer is lowered to the surface of the pad and is planarized.

The desired result of successful CMP operations is a uniform planar surface remaining on the processed wafer. Typically the removal rate of films on the wafer is carefully tracked or monitored. Various attempts have been made to control the operation of chemical mechanical planarization systems in order to provide uniform removal rates. One common attempt is to control down force applied by the wafer carrier or other workpiece holding device, delivering variable pressure to an abrasive polishing surface. Unfortunately, down force variation can lead to local degradation of so-called dishing and erosion performance at the sections of the wafer where high compensative down force was applied. Excessive down force may cause additional quality issues like film delamination, scratching, or inter-grain boundary damage. The focus on uniformity of removal rates may sometimes be misguided for current applications. That is, from the end user's perspective, it is desired to have a uniform post-CMP layer on the surface of the semiconductor wafer, which is not necessarily the result of uniform removal rate. For example, if the surface of the wafer prior to planarization is not uniformly thick, the non-uniformities are maintained when a uniform removal rate is applied to the processed wafer. A uniform removal rate applied to substrate with greater edge thickness will result in a wafer with a lower center thickness, a condition similar to the wafer prior to the planarization application. Additionally, in the example related above, over-polishing of the center of the wafer can result in lost die and lower wafer yield.

During the CMP operation there are many opportunities for measuring device features on wafers. Many of the features can be determined by capturing a signal indicating the feature. As features continue to decrease in size, especially the thickness of films employed in the manufacture of semiconductors, the signals that are indicative of the feature become undetectable in certain situations. Inductive sensors may be used for displacement, proximity and film thickness measurements. The sensors rely on the induction of current in a sample by the fluctuating electromagnetic field of a test coil proximate to the object being measured. Fluctuating electromagnetic fields are created as a result of passing an alternating current through the coil. The fluctuating electromagnetic fields induce eddy currents which generate their own fields, superimposing with the primary field and change the coils inductance. Feedback from sensors such as inductive sensors during planarization can allow for real-time monitoring and correction if needed during the CMP operation.

In view of the foregoing, a technique for controlling the composition and amount of fluids supplied differentially on a polishing pad during a planarization operation is needed to more accurately influence the removal rate variation over a wafer surface.

SUMMARY OF THE INVENTION

Broadly speaking, the present invention is an apparatus that provides control over planarization resulting in a specified remaining film thickness on a semiconductor wafer. It should be appreciated that the present invention can be implemented in numerous ways, including as an apparatus, a system, a device, or a method. Several inventive embodiments of the present invention are described below.

In accordance with one embodiment of the present invention, an apparatus for use in a chemical mechanical planarization system is provided. A fluid displacing device is capable of being positioned at a proximate location over a polishing pad. The fluid displacing device is configured to displace at least part of a first fluid from a region of the polishing pad. A fluid delivery device is capable of replacing the first fluid with a second fluid at the region of the polishing pad. The second fluid that replaces the first fluid is different from the first fluid.

In accordance with another embodiment of the present invention, a system for processing semiconductor substrates is provided. The system includes a polishing pad, and a wafer carrier capable of being positioned at a proximate location over a polishing pad that is configured to receive a wafer. A first fluid capable of being placed on the polishing pad assists in a planarization of the wafer held by the wafer carrier. A fluid restraining device is capable of distributing the first fluid across the polishing pad. A fluid displacing device capable of being positioned at a proximate location over the polishing pad between the fluid restraining device and the carrier head is capable of displacing at least part of the first fluid from a region on the polishing pad. A fluid delivery device is capable of replacing the first fluid with a second fluid at the region of the polishing pad, the second fluid being different than the first fluid.

In accordance with yet another embodiment of the present invention, a method of controlling properties of a film present over a polishing pad surface is provided. The method includes displacing a fluid present on a region of a polishing surface and replacing the displaced fluid with a second fluid at the region of the polishing surface. The replacing at the region occurs after the displacing so that the second fluid occupies the region previously occupied by the displaced fluid.

In accordance with another embodiment of the present invention, a method of controlling properties of a film present over a polishing pad surface is provided. The method includes displacing at least partially a fluid present on a region of a polishing surface and replacing the displaced fluid with a second fluid at the region of the polishing surface. The replacing at the region occurs after the displacing so that the second fluid occupies at least part of the region previously occupied by the displaced fluid.

The advantages of the present invention are numerous. Incoming film thickness variation on wafer surfaces provides a need for a method and apparatus that can differentially vary concentrations of slurry, water, and other fluids on zones of the polishing surface in order to apply independent planarization of regions on the wafer surface material. Precise zonal control over fluids applied to a polishing surface through displacement of fluid present on the polishing surface and replacement of fluid in that displaced region can increase or decrease the removal rate of material on the wafer. The goal of enabling independent regional planarization is to provide control over the uniformity of the targeted remaining layer thickness in contrast to traditional efforts to ensure a uniform removal rate across the wafer surface.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 5A is side view of an alternate configuration, in accordance with one embodiment of the present invention.

FIG. 5B is top view of the present invention employed in a rotary type system, in accordance with one embodiment of the present invention.

DETAILED DESCRIPTION OF THE INVENTION

Several exemplary embodiments of the invention will now be described in detail with reference to the accompanying drawings. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

The foregoing description provides several embodiments designed to control material planarization of wafer layer surfaces through the precision control of fluids applied to a polishing surface in a Chemical Mechanical Planarization system. Broadly speaking the first methodology (A) employs removal of fluid present at a proximate location on the polishing surface and replacement of the fluid with an alternative fluid in order to control the planarization at a particular region on a substrate applied to the polishing surface by a carrier head. A second methodology (B) employs displacement of fluid present on the polishing surface and replacement of fluid in that displaced region that can increase or decrease the amount of planarization affected at the substrate held by the carrier.

A. Removal and Replacement

Figure 1:
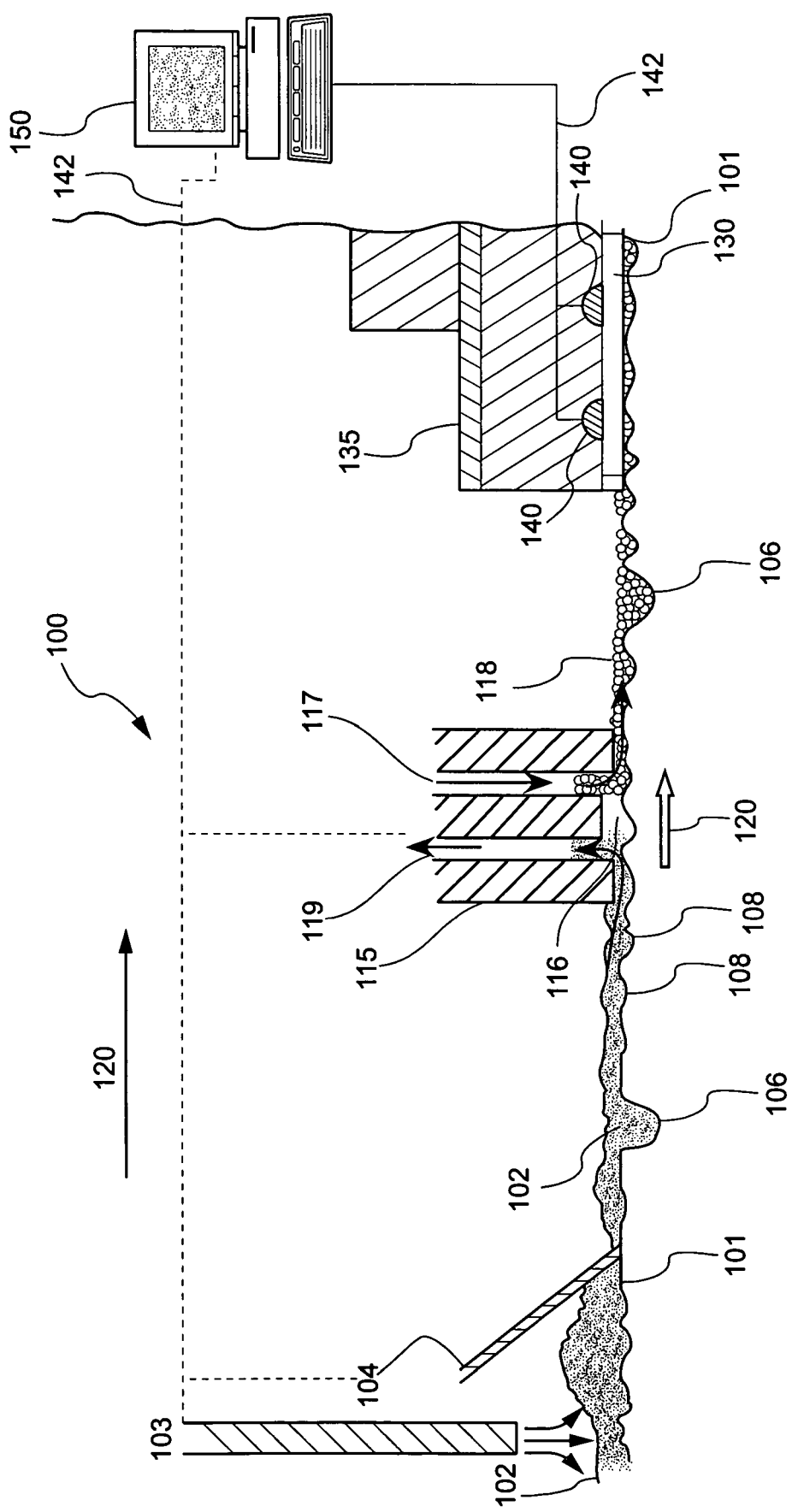
FIG. 1 is a cross-sectional diagram of a chemical mechanical planarization (CMP) system used for the differential closed loop planarization control, in accordance with one embodiment of the present invention.

FIG. 1 is a schematic diagram of a chemical mechanical planarization (CMP) system 100 capable of providing real time differential closed loop control in accordance with one embodiment of the invention. A wafer 130 held by a wafer carrier 135 is rotated against polishing pad 101. A fluid delivery device 103 delivers a first fluid 102 to polishing pad 101. The first fluid 102 typically contains a slurry intended for chemical mechanical planarization of a wafer 130 that consists of both chemical and physical abrasives which affect removal of material on the surface of a wafer. Slurry on the polishing pad 101 may be joined by other particulates, abrasives, material residues, pad residues, de-ionized water, and isopropyl alcohol already resident on the polishing pad 101 all of which combine to form a film across the surface of the polishing pad 101. Grooves 106 and micropores 108 in the polishing pad 101 transport the first fluid 102 in the direction 120 of the wafer carrier 135. It should be appreciated that any suitable technique may be used to deliver fluid to the polishing pad 101 such as pump, air pressure, etc.

A fluid restraining device 104, also referred to as a dam, located downstream from the delivery device, is forced against polishing pad 101 to evenly distribute the first fluid 102 over the surface of the polishing pad 101. Even distribution entails uniform disbursement of slurry across the width of the polishing pad 101, creating a uniform film that proceeds in the direction of the wafer. The delivery device 103, therefore does not have to be an instrument requiring precise distribution of the first fluid 102 to the polishing pad 101. The fluid flow restraining device 104 presses against polishing pad 101 creating a pool of the first fluid 102 upstream from the fluid restraining device 104. It will be apparent to one skilled in the art that fluid restraining device 104 may be clipped or affixed by other suitable technique to an arm extending over polishing pad 101. The arm extending over polishing pad 101 may be controlled in a vertical as well as a horizontal direction in order to control the angle and gap, relative to polishing pad 101. In one embodiment, fluid restraining device 104 is composed of the same material of polishing pad 101, i.e., polyurethane. It should be appreciated, however, that fluid restraining device 104 may be constructed from any material which is compatible with the CMP operation and is capable of creating a pool of the first fluid 102 while providing for the even distribution downstream.

Still referring to FIG. 1, a head 115 is located between the fluid restraining device 104 and the wafer carrier 135. The location of the head 115 over the polishing pad 101 may be between about 0.1 mm and about 1 mm and will be optimized to provide best execution response. The exact optimal position will depend on the first fluid 102 dispensing rate, its viscosity, wetting coefficient, and other parameters defining the efficiency of the head 115 in replacing the first fluid 102 with a second fluid 118. The head 115 has at least one input 117 capable of delivering a second fluid 118 and at least one output 119 capable of removing the first fluid 102 and a portion of the second fluid 118 by way of vacuum and other pressurized techniques. Delivery of the second fluid 118 includes even distribution at the desired location on the surface of the polishing pad 101. The second fluid 118 may be one of an abrasive-free chemically inert liquid, deionized water and other process indifferent fluids. A gap 116 adjacent to the surface of the polishing pad 101 between one of the inputs 117 and one of the outputs 119 of the head 115 allows for the second fluid 118 to dilute and remove the first fluid 102 via the output 119. Dilution of the first fluid 102 slows, and in the limit removal of the first fluid 102, prevents planarization of the wafer 130 by the CMP system. During removal of the first fluid 102, primarily slurry along with other constituents of the film such as particulates, material residues and pad residues, a portion of the second fluid 118, namely de-ionized water, proceeds in the direction 120 of the wafer carrier 135. There is effectively reduced or no planarization of a surface of the wafer 130 when the second fluid 118 is applied to the polishing pad 101.

As described above, when the polishing pad 101 moves in the direction 120 toward the application area it carries with it a first fluid 102, which may be a film containing material such as slurry, particulates, material residues, and pad residues. In one embodiment a portion of the material remaining on the polishing pad 101, the first fluid 102, is removed prior to the addition of the second fluid 118, which may be one of an abrasive-free chemically inert liquid, deionized water and other process indifferent fluids. Some portion of the second fluid 118 may be removed along with the first fluid 102 through the gap 116 and the output 119 in the head 115. In this manner, the second fluid 118 may assist in the removal of the first fluid 102 by providing a diluting and lifting effect of the first fluid 102 from the surface of the polishing pad 101. In another embodiment, all of the material remaining on the polishing pad 101, the first fluid 102, is removed by the output 119 in the head 115 prior to the application of the second fluid 118 through the input 117. In the case of complete removal or near complete of the first fluid 102 and replacement with the second fluid 118, the second fluid 118, a process indifferent fluid, proceeds in the direction 120 of the application area providing effectively reduced or no material removal in the specified portion of the wafer 130.

The wafer carrier 135 is capable of incorporating at least one sensor 140 configured to detect material properties of the wafer and the progress of the CMP operation. In one embodiment, the sensor may detect a signal indicating a film thickness. In the case of conductive films, the plurality of sensors 140 may be inductive sensors configured to detect a signal produced by a magnetic field emitted by the induced current. Frequently, the signal indicating the thickness of the film includes third body effects. Inductive sensors allow for the contactless measuring of a thin conductive (eg. metal) film thickness in the full range of thicknesses normally utilized in semiconductor manufacturing, typically varying from about 0–15,000 Angstroms. It has been determined that inductive sensors are capable of providing a fast enough response for a wafer moving under typical loading robotics velocity. Therefore, it is possible to perform thickness measurements during processing without impacting process throughput. Moreover, the movement of the wafer can be taken advantage of to produce a film thickness profile from a limited number of sensors in a cluster configuration. For example, wafer aligners provide movement in a rotational direction and a linear radial direction to position wafers in a consistent manner. Accordingly in the present invention, a cluster of sensors can capture a film thickness profile of a wafer while the wafer is undergoing common automated wafer handling techniques, or while being rotated during CMP. As the wafer 130 is rotated, a film thickness profile can be generated for the wafer 130 so that the head 115 can optimize slurry displacement for the desired thickness profile.

Still referring to FIG. 1, a computer 150, also referred to as a controller, coordinates the various control activities for the CMP system 100. The computer 150 is capable of communication 142 with the plurality of sensors 140, the head 115, the fluid restraining device 104 and the fluid delivery device 103. The computer 150 may be configured to adjust the signal indicating the thickness of the film from the sensors 140 to substantially remove both third body effects introduced by the CMP system and a substrate thickness component. According to the value of the adjusted signal, control signals for second fluid 118, the fluid restraining device 104, and fluid delivery device 103 may be generated. Film thickness feedback from the sensors 140 provides the computer 150 information necessary to regulate removal rates via commands issued to the head 115. If the signal generated by any one of sensors 140 indicates that the removal rate is too high, i.e., the thickness is lower in a particular region of wafer 130 corresponding to one of the sensors 140, then the second fluid 118, being either deionized water or some other suitable displacement chemistry may be distributed through the one of the inputs 117 on the head 115 in order adjust the degree of planarization and reduce the removal rate experienced at the corresponding point on wafer 130. Similarly, when a desired thickness on a portion of the wafer 130 has been obtained, the head 115, operating as an execution and correction system, replaces the first fluid 102 with second fluid 118 preventing further planarization in the affected area. As used herein, an execution and correction system receives commands from the computer 150 and performs an operation such as fluid delivery and removal in the present invention. Correction and adjustment of the processing application is provided by the head 115 when slurry is removed at specified locations on the surface of the polishing pad 101.

Figure 2:
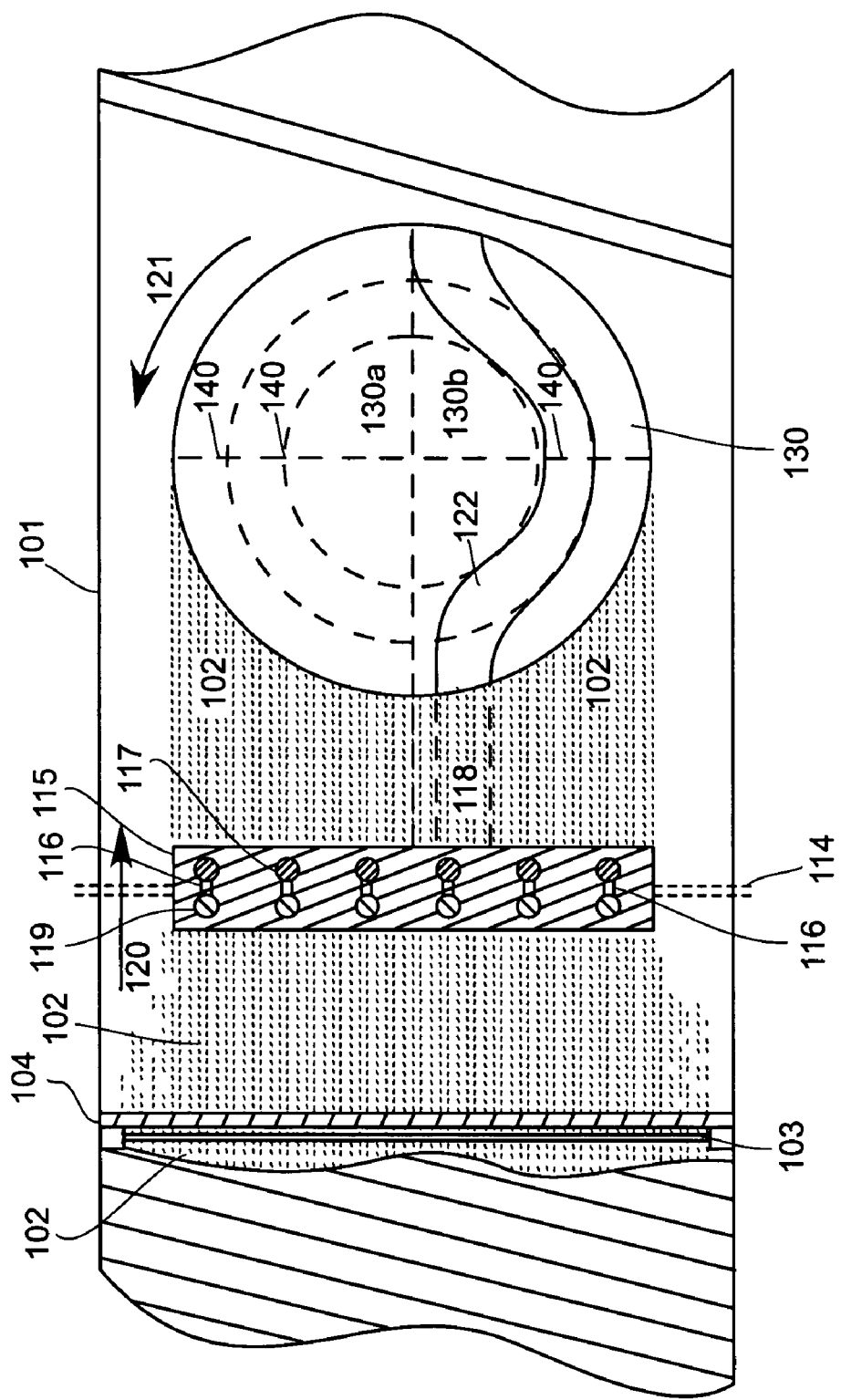
FIG. 2 is a top view diagram of a differential control loop chemical mechanical planarization (CMP) system showing a single head with several inputs and outputs, in accordance with one embodiment of the present invention.

FIG. 2 provides a top view of the CMP system described above. It should be appreciated that the rotational velocity of wafer 130, along with the linear velocity of polishing pad 101, creates a situation where fluid directed at the center of wafer 130 is pushed off to the side due to the rotational velocity of the wafer 130. In that situation, e.g., where slurry is present on the polishing pad 101, the center of wafer 130 experiences a lower removal rate due to a lesser amount of slurry being available at the center. The head 115 downstream from the fluid restraining device 104 applies differential removal rates to portions of a surface of wafer 130 by removal of slurry and replacement with water at a plurality of locations designated by the sensors 140. Additionally the rotation of the wafer provides for an alternative path 122 for fluids directed under the wafer carrier 135. The path of fluids delivered on a linear belt will affect a circular application when applied to the wafer in rotation. The inputs 117 capable of providing the second fluid are also capable of being placed in a position according to the anticipated rotation of the wafer 130 in a direction 121.

In the case of linear belt CMP systems, it should be appreciated that the belt is capable of moving in a linear direction 120 towards the wafer 130 while the wafer 130 is spinning about its axis. Thus, the relative velocity experienced where the polishing pad 101 and wafer 130 motion is opposite in the top section otherwise known as the high relelatve velocity section 130a of wafer 130. When the of the wafer 130 in rotation and polishing pad 101 move in the same relative direction as shown in the bottom section, a low relative velocity section 136b. As a result, the polishing pad 101 tends to stain in the region experiencing the higher relative velocity, due to deposition of a greater amount of colored copper process by-products and debris, produced at the high relative velocity section 130a of the polishing pad 101. Thus, one function of the fluid restraining device 104 and the pool of the first fluid 102 is to collect and distribute the debris more uniformly rather than having the debris recycle in the same general area of polishing pad 101. Uniform distribution of the debris may extend the life of the polishing pad 101 by promoting a more uniform wearing pattern.

As shown in FIG. 2, it should be appreciated by those skilled in the art that the fluid may be removed by outputs 119 and a second fluid 118 may be delivered and at one or multiple locations. The locations of the inputs 117 and outputs 119 can be configured on the head 115 enabling isolation of specific regions on the surface of the polishing pad 101 in order to control the removal rate applied to wafer 130. Because a gap 116 adjacent to the surface of the polishing pad 101 between one of the inputs 117 and one of the outputs 119 of the head 115 allows for the second fluid 118 to dilute and remove the first fluid 102 via the output 119, it can be said that the inputs 117 and the outputs 119 are coupled together in pairs. The activation of pairs of the inputs 117 and outputs 119 can be independently controlled by the computer 150 as described in FIG. 1 above, so that the computer 150 can isolate removal of the first fluid 102 in designated sections of the polishing pad 101. The head 115 could contain a plurality of inputs 117 and outputs 119 as shown spanning the width of the polishing pad 101. The head 115 could be held by an arm 114 that extends across the width of polishing pad 101 that operate in the fashion described in FIG. 1 above. The arm 114 could be supported by an apparatus above the polishing pad 101 or could be supported by other structures on the system by extending beyond the polishing pad 101.

Figure 3:
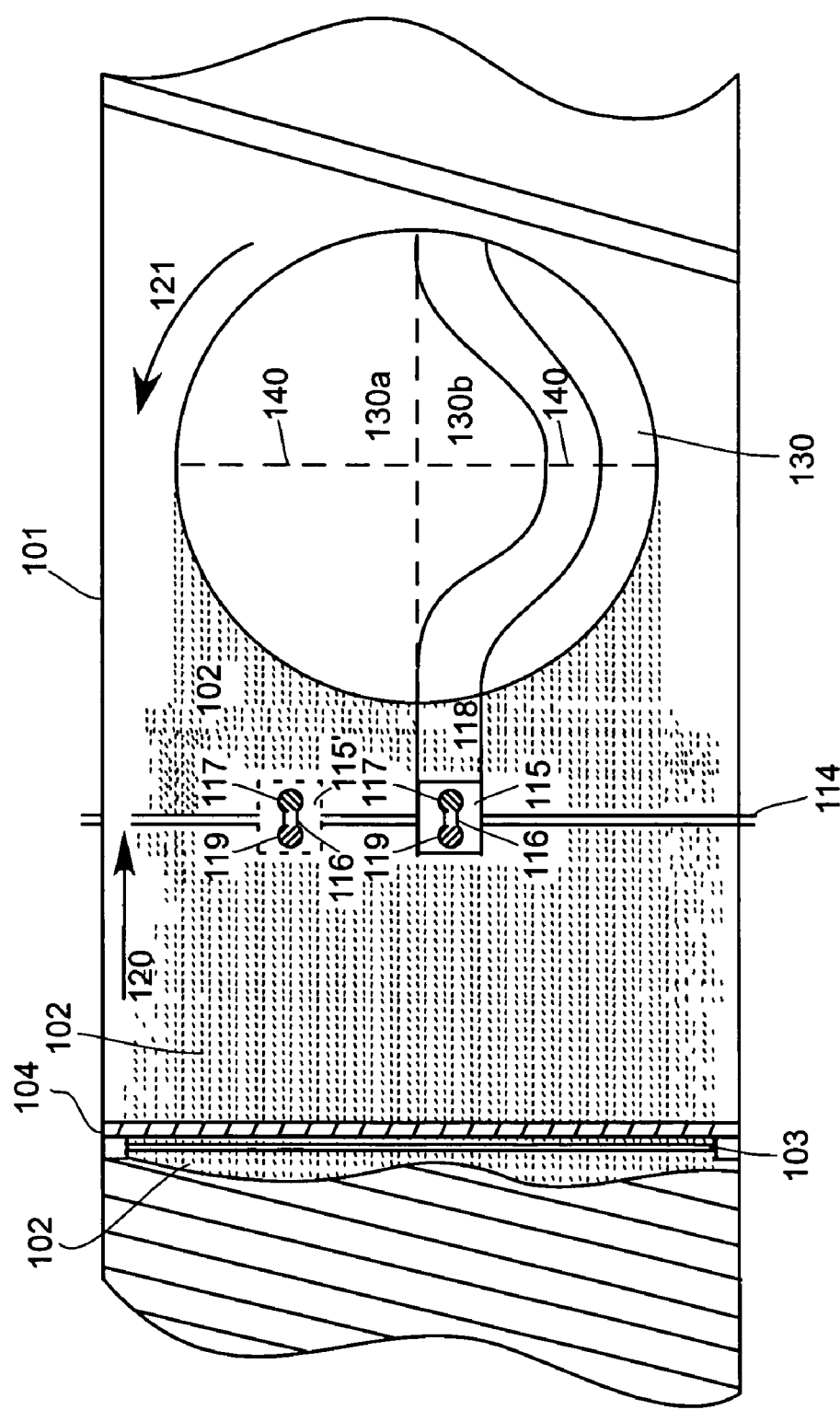
FIG. 3 is a top view diagram of a differential control loop chemical mechanical planarization (CMP) system showing a head that can slide on an arm, in accordance with one embodiment of the present invention.

FIG. 3 provides an alternative arrangement of the head 115 configured on the arm 114. The head 115 could move linearly along an arm 114 that extends across the width of polishing pad 101 as illustrated in FIG. 3. The location of the head 115 can enable isolation of specific regions on the surface of the polishing pad 101 under the inputs 117 and outputs 119 in order to control the removal rate applied to wafer 130. A plurality of heads 115' may be optional for improved coverage of the application area, the area of the polishing pad 101 that will pass below the surface of the wafer 130. The head 115 and the heads 115' could move linearly in concert or independently along an arm 114 that extends across the width of polishing pad 101. The computer 150, described in FIG. 1 above, is capable of providing orchestration of the movement of head 115 or heads 115' in order to properly prepare the polishing pad 101 for the differentially controlled planarization operation.

Figure 4:
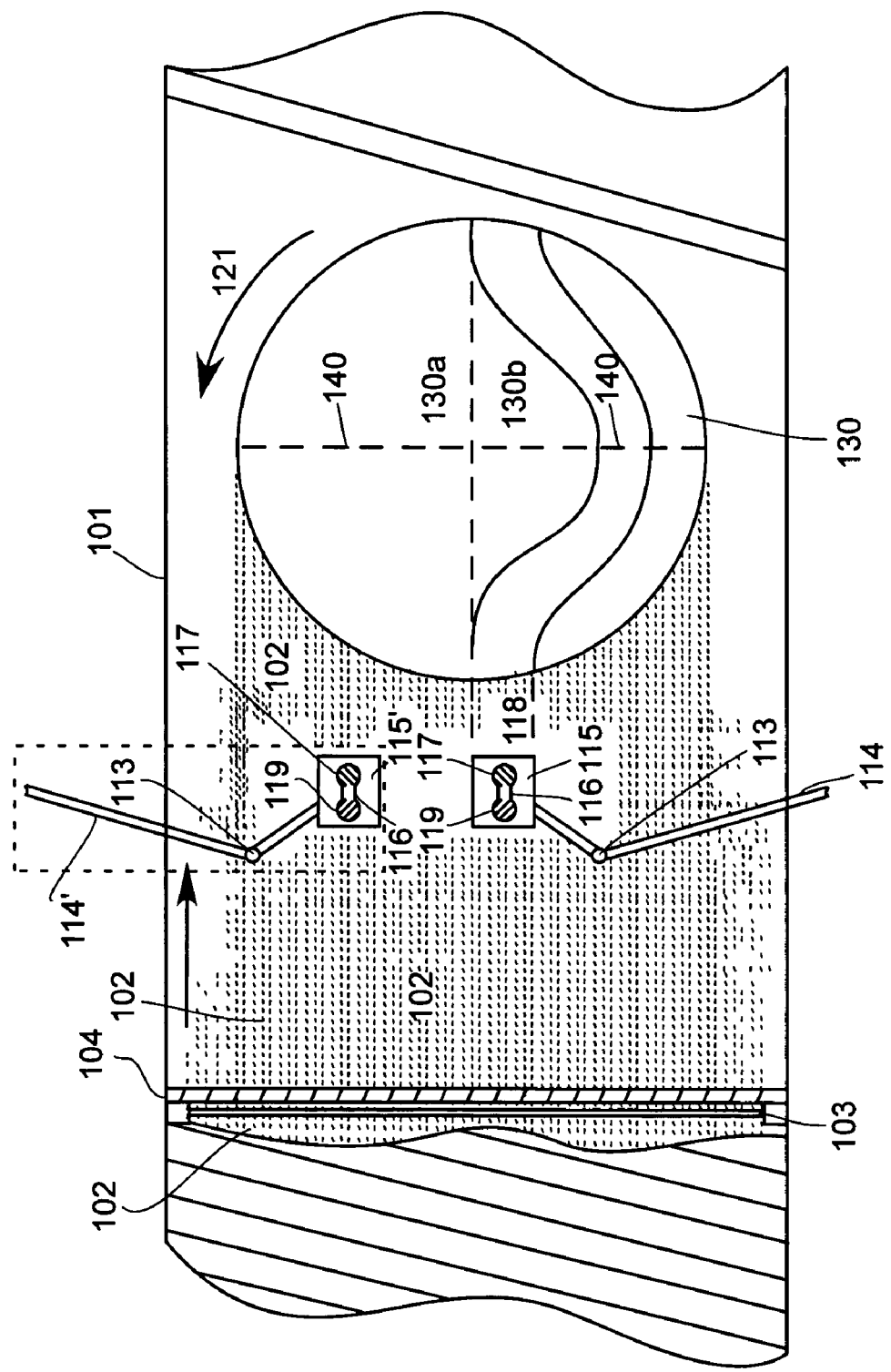
FIG. 4 is a top view diagram of a differential control loop chemical mechanical planarization (CMP) system showing a head that can be moved by an extending arm, in accordance with one embodiment of the present invention.

Alternatively, as shown in FIG. 4, the arm 114 could move the head 115 to locations designated by the sensors 140. The arm 114 may have several joints 113 and may be controlled by any suitable technique such as a step motor, servo motor, etc., in order to direct slurry, deionized water, or some other suitable fluid on the surface of polishing pad 101 downstream from fluid restraining device 104, in order to control the removal rate applied to wafer 130. Additionally a plurality of arms 114' could move a plurality of heads 115' to locations designated by the computer 150 as described in FIG. 1 for polishing pad 101 preparation.

FIG. 5A is side view of an alternate configuration of the CMP system described in FIG. 1 above. A wafer carrier 135 may be configured over a polishing pad in a rotary platform. The head 115 containing inputs 117 and outputs 119 allows the second fluid 118 to dilute and remove the first fluid 102 from the film on the polishing pad 101.

FIG. 5B is top view of a rotary type configuration CMP system utilizing removal and replacement of film on the polishing pad. An arm 114 supports a head 115 over a rotating polishing surface upstream of a wafer carrier 135. A fluid delivery device 103 and a fluid restraining device 104 are upstream of the head 115.

Figure 6:
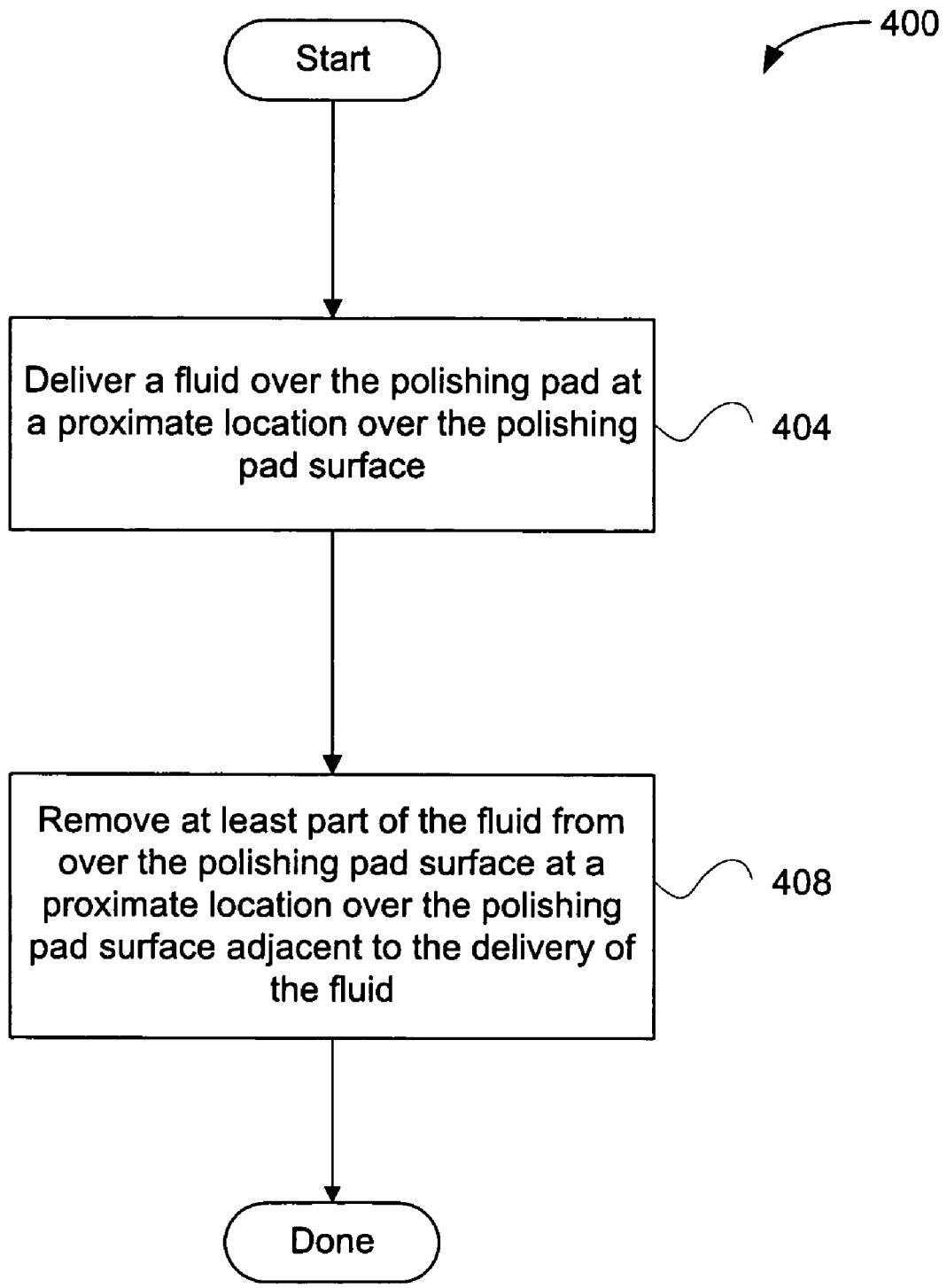
FIG. 6 is a flow chart of a method for controlling properties of a film over a polishing pad surface, in accordance with one embodiment of the present invention.

FIG. 6 is a flow chart of a method for controlling properties of a film over a polishing pad in accordance with one embodiment of the invention. The method begins by delivering a fluid over the polishing pad at a proximate location over the polishing pad surface in operation 404. In operation 408, at least part of the fluid from over the polishing pad surface is removed at a proximate location over the polishing pad surface adjacent to the delivery of the fluid. The removal of fluid from the film over the polishing pad surface can assist in controlling properties of the film. The film may include slurry, an amount of de-ionized water, an amount of chemicals, isopropyl alcohol, particulates, abrasives, material residues, and pad residues. The composition of the film on the polishing pad has a direct effect on the planarization performed on the surface of the wafer. Removing slurry from the film slows down material removal at a proximate location on the polishing pad surface.

Figure 7:
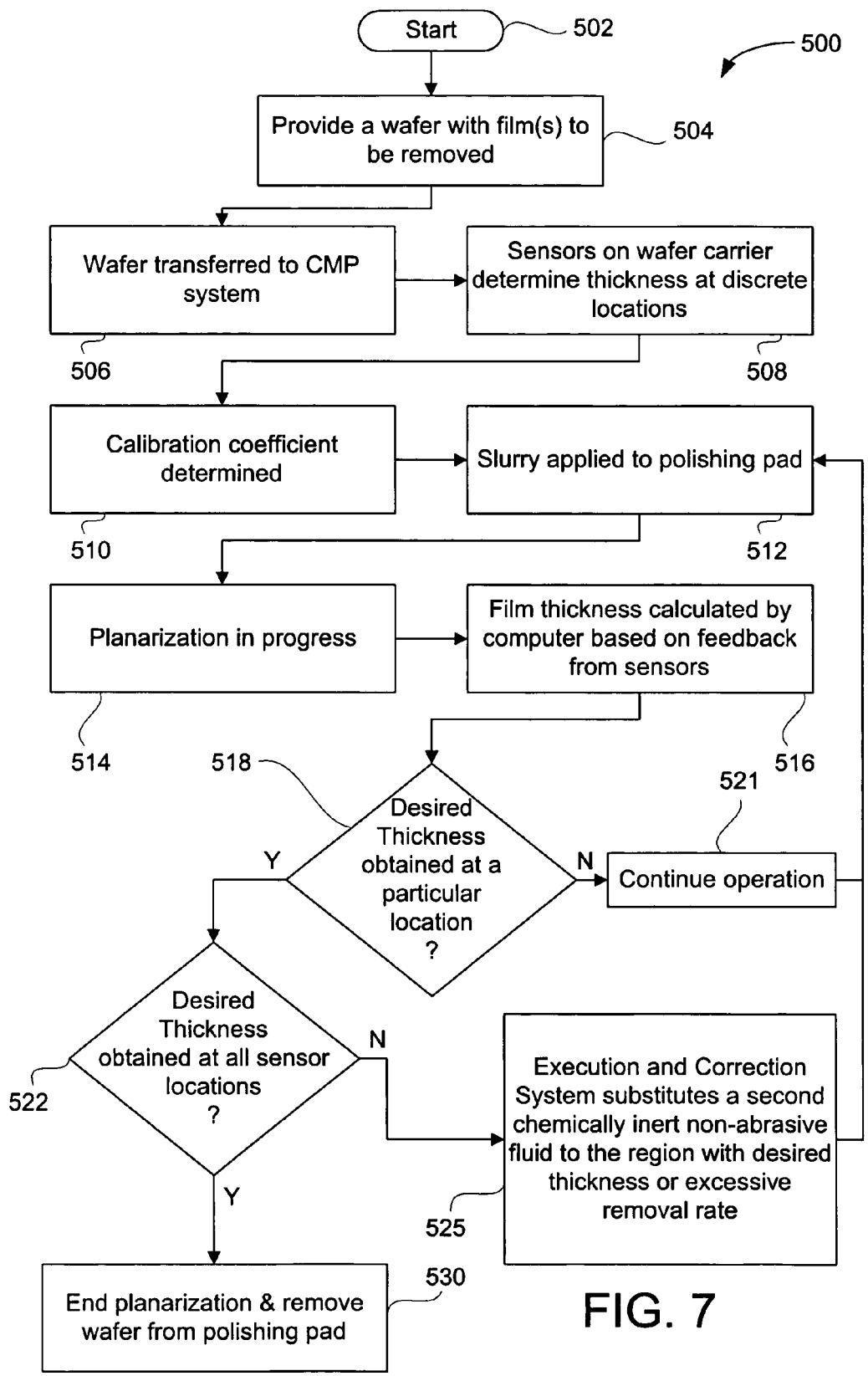
FIG. 7 is a flow chart of a method for providing differential control for removal rates applied to a substrate surface through a removal of slurry from the polishing pad, in accordance with one embodiment of the present invention.

FIG. 7 is a flow chart diagram illustrating an operational method for providing differential control of removal rates applied to the surface of a wafer in accordance with one embodiment of the invention. The method begins when a wafer is provided for the purpose of having a film or films removed in operation 504. A thickness map of the substrate could be generated prior to a processing operation. The thickness map may be generated as the surface of a wafer is scanned to obtain thickness data in the absence of external inductive objects, or third bodies. Here, an aligner and other transfer stations may be used to scan the surface of the wafer in order to create a thickness map as described above. Third bodies, i.e., conductive objects are not present here as only the wafer and the scanning mechanism is used to create the thickness map. A substrate component of the thickness data and a film component of the thickness data is identified. Here, the signal generated by scanning the surface of the wafer is subdivided into the substrate component and a film component. For example, an inductive signal may be broken down into the two components. It should be appreciated that from this component data, calibration coefficients may be generated which may be subsequently applied to a downstream measurement of the thickness, i.e., a sensor embedded in a wafer carrier, in order to more precisely determine the thickness.

The method then proceeds to operation 506 where the wafer is transferred to a processing station. In one embodiment, the processing station is a CMP system. Of course, any suitable robotic, mechanical, or manual technique may be used to transfer the wafer to the processing station. The method then moves to operation 508 where sensors on the wafer carrier determine film thickness corresponding to discrete points on the wafer and the presence of third bodies is detected. Here, one or more sensors embedded in the wafer carrier as described above with reference to FIGS. 1–4 may be used to detect the thickness data. In one embodiment, an inductive sensor is used for this detection, however scatterometers, spectral reflectometry, thermal monitoring, stress monitoring, and other sensors could be employed.

Next in operation 510, thickness data corresponding to the point on the wafer is adjusted to substantially eliminate both the substrate component and the third body effects. That is, the calibration coefficient determined in the absence of external inductive objects, or third bodies is used to isolate the thickness data related to the film on the wafer described above. A coordinate of the thickness map is associated with a sensor (eg. inductive sensor described above) utilized in the processing operation. A point on the thickness map may be associated with a sensor embedded in the wafer carrier so that the planarization process may be controlled in the region associated with the sensor embedded in the wafer carrier. A computer, also known as a controller, as described in FIG. 1 above may provide the calculations necessary to make this association. When slurry is applied to the pad in operation 512, planarization of the wafer surface begins in operation 514. Film thickness at discrete locations is calculated by the computer based on feedback from the sensors 516 as describe above. Until desired thickness is obtained at a particular location in operation 518, the planarization process continues per operation 521. If the desired thickness is obtained a particular location a query of all sensor locations is made in operation 522. If desired thickness is obtained at some but not all locations, a head removes slurry from regions having desired thickness or excessive removal rates and substitutes a second chemically inert non-abrasive fluid in operation 525 as described in FIGS. 1–4 above. The method then continues to apply slurry to the polishing pad in operation 512 while areas designated by the computer as having obtained the desired thickness have the second fluid substituted for slurry. Operation 512 continues until sensors at all locations indicate that the desired thickness has been obtained in operation 522. When desired thickness has been obtained at all positions on the wafer, the planarization process is complete and the wafer is removed from the polishing pad in operation 530.

In summary, the CMP system described in FIGS. 1–7 is capable of being configured to differentially control removal rates being applied to regions of a wafer through the removal and replacement of fluid on the polishing medium. Through the use of a fluid restraining device that creates a pool, a uniform slurry layer is defined downstream of the restraining device. A head, operating as an execution and control system provides process control by removing abrasives at designated locations corresponding to sensor locations on the wafer carrier in order to arrive at a substrate having a uniform film thickness. The uniform slurry layer that is provided by the fluid restraining device is removed in areas where a desired film thickness has been obtained. A plurality of sensors allow for the determination of the endpoint and associated removal rates by initially determining a thickness of a film on the wafer under non-process conditions and also during the planarization process. Furthermore, the above described embodiments may be applied to rotary or orbital type CMP systems as well as linear CMP systems that rely upon belt type polishing media.

B. Displacement and Replacement

Figure 8:
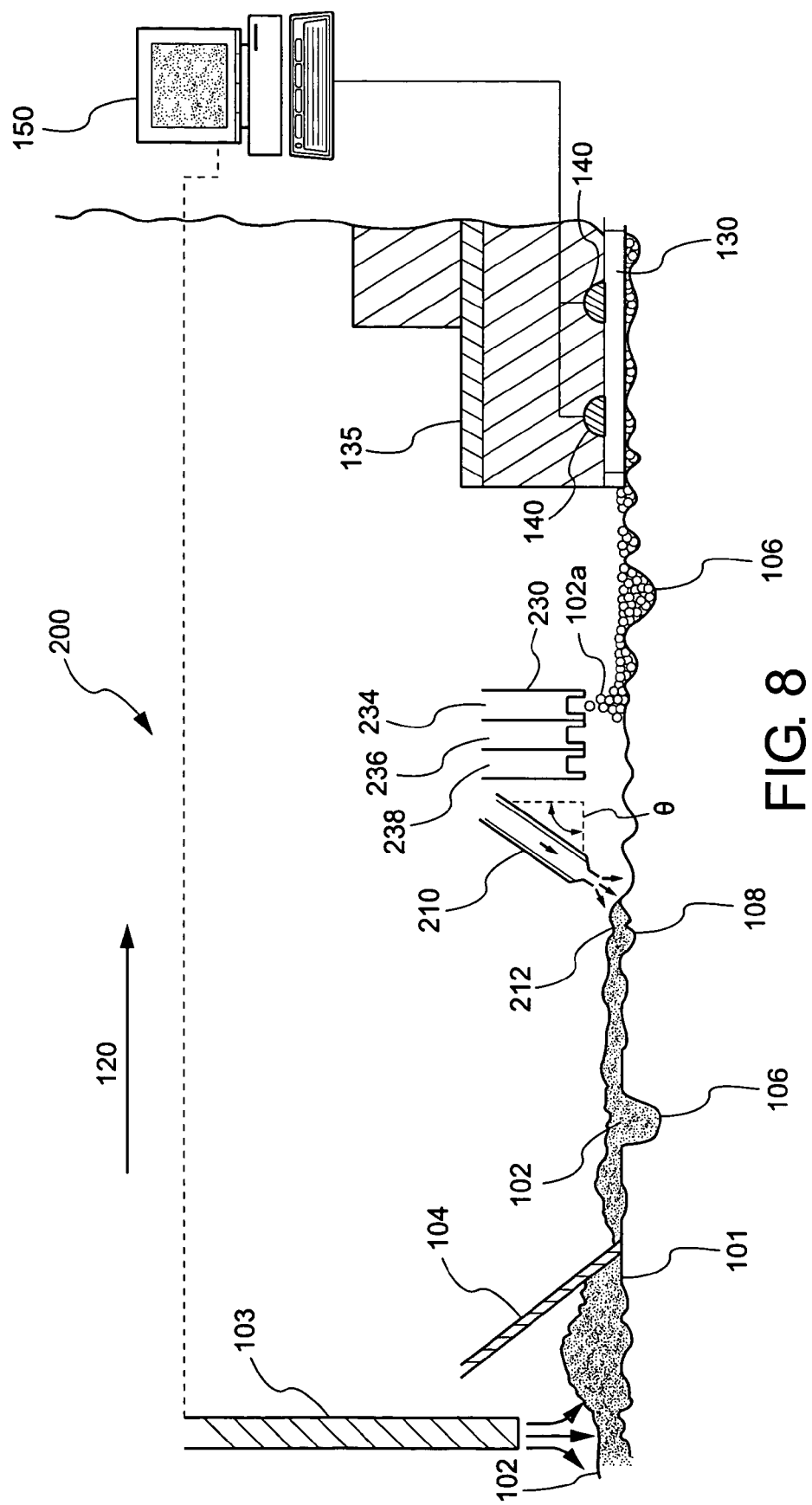
FIG. 8 is a schematic diagram of a chemical mechanical planarization (CMP) system capable of providing real time differential closed loop control in accordance with a second methodology of control.

FIG. 8 is a schematic diagram of a chemical mechanical planarization (CMP) system 200 capable of providing real time differential closed loop control in accordance with a second methodology of control. A wafer 130 held by a wafer carrier 135 is rotated against polishing pad 101. A fluid delivery device 103 delivers a first fluid 102 to polishing pad 101. The first fluid 102 typically contains a slurry intended for chemical mechanical planarization of a wafer 130 that consists of both chemical and physical abrasives which affect removal of material on the surface of a wafer. Slurry on the polishing pad 101 may be joined by other particulates, abrasives, material residues, pad residues, de-ionized water, and isopropyl alcohol already resident on the polishing pad 101 all of which combine to form a film across the surface of the polishing pad 101. Grooves 106 and micropores 108 in the polishing pad 101 transport the first fluid 102 in the direction 120 of the wafer carrier 135. It should be appreciated that any suitable technique may be used to deliver fluid to the polishing pad 101 such as a pump, air pressure, etc.

A fluid restraining device 104, also referred to as a dam, located downstream from the delivery device, is forced against polishing pad 101 to evenly distribute the first fluid 102 over the surface of the polishing pad 101. Even distribution entails uniform disbursement of slurry across the width of the polishing pad 101, creating a uniform film that proceeds in the direction of the wafer. The delivery device 103, therefore does not have to be an instrument requiring precise distribution of the first fluid 102 to the polishing pad 101. The fluid flow restraining device 104 presses against polishing pad 101 creating a pool of the first fluid 102 upstream from the fluid restraining device 104. It will be apparent to one skilled in the art that the fluid restraining device 104 may be clipped or affixed by other suitable technique to an arm extending over polishing pad 101. The arm extending over polishing pad 101 may be controlled in a vertical as well as a horizontal direction in order to control the angle and gap, relative to polishing pad 101. In one embodiment, fluid restraining device 104 is composed of the same material of polishing pad 101, i.e., polyurethane. It should be appreciated, however, that fluid restraining device 104 may be constructed from any material which is compatible with the CMP operation and is capable of creating a pool of the first fluid 102 while providing for the even distribution downstream.

Still referring to FIG. 8, a fluid displacing device 210, is located between the fluid restraining device 104 and the wafer carrier 135. The fluid displacing device 210 may be positioned above the polishing pad 101 from between about 0.1 mm and about 25 mm and will be optimized to provide the best controlled displacement of the fluid present on the polishing pad 101 downstream of the fluid restraining device 104. The exact optimal position will depend of the first fluid 102 dispensing rate, its viscosity, wetting coefficient, the advancing speed of the polishing pad 101 approaching the fluid displacing device 210. Other parameters may also effect the ability of the fluid displacing device 210 to provide a displacing fluid 212 to effectively clear the grooves 106, micropores 108, and surface of the polishing pad 101 of the first fluid 102 at a proximate location between the fluid restraining device 104 and the wafer carrier 135. The displacing fluid 212 may be one of clean dry air (CDA), nitrogen (N2) or other suitable gas that can provide displacement of the first fluid 102 present of the polishing pad 101. An amount of fluid pressure necessary to displace the first fluid 102 from a region on the polishing pad 101 by the displacing fluid 212 may be released through the fluid displacing device 210. A nozzle or other suitable method may be used in order to provide about 5 to about 40 pounds per square inch (PSI) of fluid pressure. The fluid displacing device 210 may be offset from the polishing pad 101 by an angle θ, which may be between about 10 degrees and up to about 90 degrees. A line perpendicular or normal to the polishing pad 101 may establish an appropriate reference for measurement of the angle θ. The angle θ for application of the displacing fluid 212 may be optimized so as to provide for optimal displacement of the first fluid 102 from the polishing pad 101.

Still referring to FIG. 8, during positive operation of the fluid displacing device 210 an area of the polishing pad 101 immediately adjacent to and below the fluid displacing device 210 is substantially void of fluid due to displacement by the displacing fluid 212. Because the polishing pad 101 is advancing in the direction 120 the area void of fluid will advance in the direction 120 toward the wafer carrier 135. Above the area void of fluid and downstream of the fluid displacing device 210 a fluid delivery device 230 is capable of replacing the first fluid 102 with a second fluid 102a. Different than the first fluid 102 provided by a fluid delivery device 103 upstream of the fluid restraining device 104, the second fluid 102a may be one or a combination of de-ionized water, slurry, and a variable abrasive-level slurry. The second fluid 102a can be delivered through different ports or nozzles shown as 234, 236 and 238.

In some cases the fluid displacing device 210 may not fully displace all film and fluids present on a polishing pad 101. When a very thin film remains in the grooves 106 and micropores 108 in a region, the effect of that film will be minimized by the substantial replacement of the second fluid 102a supplied by the fluid delivery device 230. The film remaining on the surface or in the polishing pad 101 grooves 106 and micropores 108 may have non-uniform distribution across the polishing pad 101, an effect which is also minimized by the relatively significant amount of the second fluid 102a serving to replace the first fluid 102. In the limit all of the first fluid 102 may be displaced and replaced by the second fluid 102a in the desired zone of the polishing pad 101.

In one embodiment the ports or nozzles can be configured to deliver slurry or a variable abrasive-level slurry through 238, a slurry through 236 and de-ionized water through 234. The selection of de-ionized water, slurry, and a variable abrasive-level slurry adjusts a degree of planarization imparted by the CMP system. The second fluid 102a from the fluid delivery device 230 is dispensed on the polishing pad 101 in the area immediately adjacent and below the fluid delivery device 230 and upstream of the wafer carrier 135. The second fluid 102a will occupy grooves 106 and micropores 108 as the polishing pad 101 advances toward the wafer carrier in the direction 120. In this manner the second fluid 102a is essentially in the material of the polishing pad 101 such that the portion within the grooves 106 and micropores 108 will proceed directly under the wafer carrier 135 even as the wafer carrier 135 is rotated. A portion of the second fluid 102a on the polishing pad 101, that is excess fluid on the top of the surface of the polishing pad 101 and outside of the micropores 108 and grooves 106, may be partially displaced by the movement of the wafer carrier 135 as the polishing pad 101 advances in the direction 120.

The displacing fluid device 210 and the fluid delivery device 230 affect a zone of the polishing pad 101. If the second fluid 102a provided by the fluid delivery device 230 consists of de-ionized water, de-ionized water will fill the grooves 106, micorpores 108, and surface of the polishing pad 101. When a zone containing de-ionized water advances under the wafer carrier 135 minimal and in the limit no planarization is achieved on the region of the surface of the wafer 130 affected. At the other end of the spectrum, if the second fluid 102a provided by the fluid delivery device 230 contains a slurry of high concentration and abrasives, that fluid will advance in the direction 120 toward the wafer carrier 135 and impart a higher removal rate of material (otherwise known as the planarization rate) on the surface of the wafer 130 pressed against the polishing pad 101 by the wafer carrier 135.

As shown in FIG. 8, the wafer carrier 135 is capable of incorporating at least one sensor 140 configured to detect material properties of the wafer and the progress of the CMP operation. Material properties capable of being detected by the sensor 140 include film thickness, conductivity, surface roughness, and topography height variations. Other suitable sensors may be used to determine the progress of CMP operations such as those described in pending U.S. patent application Ser. No. 10/672,019, and mechanical and thermal stress monitoring sensors described in pending U.S. patent application Ser. No. 10/671,978 incorporated by reference herein.

In one embodiment, the sensor may detect a signal indicating a film thickness. In the case of conductive films, the plurality of sensors 140 may be inductive sensors configured to detect a signal produced by a magnetic field emitted by the induced current. Frequently, the signal indicating the thickness of the film includes third body effects. Inductive sensors allow for the contactless measuring of a thin conductive (e.g., metal) film thickness in the full range of thicknesses normally utilized in semiconductor manufacturing, typically varying from about 0–15,000 Angstroms. It has been determined that inductive sensors are capable of providing a fast enough response for a wafer moving under typical loading robotics velocity. Therefore, it is possible to perform thickness measurements during processing without impacting process throughput. Moreover, the movement of the wafer can be taken advantage of to produce a film thickness profile from a limited number of sensors in a cluster configuration. For example, wafer aligners provide movement in a rotational direction and a linear radial direction to position wafers in a consistent manner.

Accordingly in the present invention, a cluster of sensors can capture a film thickness profile of a wafer while the wafer is undergoing common automated wafer handling techniques, or while being rotated during CMP. As the wafer 130 is rotated, a film thickness profile can be generated for the wafer 130 so that, the fluid displacing device 210, and the fluid delivery device 230 can optimize fluid on the polishing pad 101 in particular zones in order to create the desired thickness profile.

Still referring to FIG. 8, a computer 150, also referred to as a controller, coordinates the various control activities for the CMP system 200. The computer 150 is capable of communication with the plurality of sensors 140, the fluid restraining device 104, the fluid delivery device 103, the fluid displacing device 210, and the fluid delivery device 230. The computer 150 may be configured to adjust the signal indicating the thickness of the film from the sensors 140 to substantially remove both third body effects introduced by the CMP system and a substrate thickness component. According to the value of the adjusted signal, control signals for the fluid restraining device 104, the fluid delivery device 103, the fluid displacing device 210, and the fluid delivery device 230 may be generated. Film thickness feedback from the sensors 140 provides the computer 150 information necessary to regulate removal rates via commands issued to the fluid displacing device 210, and the fluid delivery device 230. The computer 150 can direct the flow of the second fluid 102a in order to deliver slurry or a variable abrasive slurry through 238, a slurry through 236 and de-ionized water through 234. The selection of de-ionized water, slurry, and a variable abrasive-level slurry or a combination adjusts a degree of planarization imparted by the CMP system.

Figure 9:
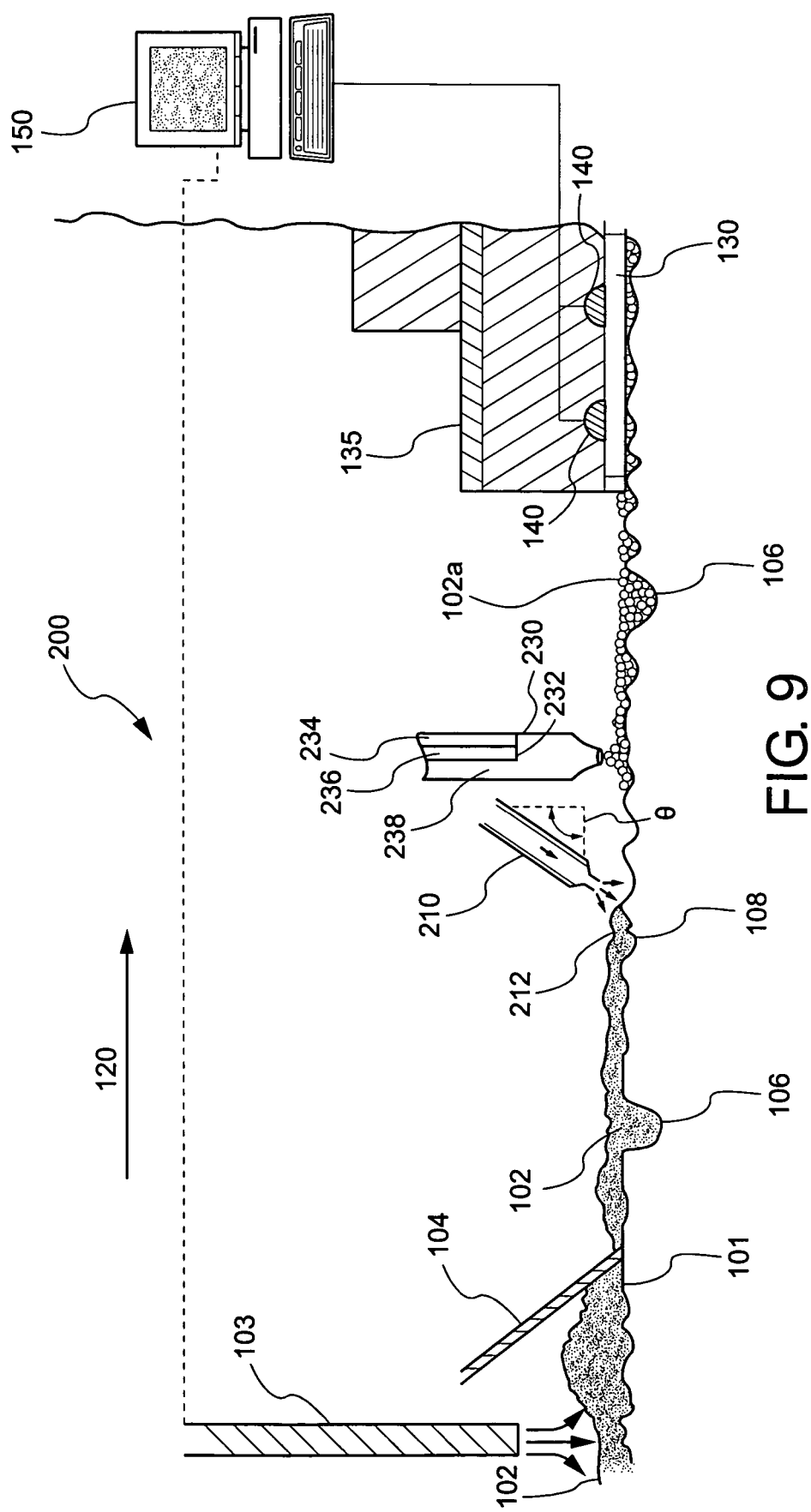
FIG. 9 is a schematic of an alternative chemical mechanical planarization (CMP) system used for the differential closed loop planarization control, in accordance with one embodiment of the present invention.

FIG. 9 is a cross-sectional view of the CMP system 200 described above that provides an alternative embodiment of the fluid delivery device 230 that delivers the second fluid 102a. As shown, the fluid delivery device 230 may be a single nozzle with several fluid inputs. Ports 234, 236 and 238 may provide de-ionized water, slurry, and variable abrasive-level slurry, respectively. A series of valves 232 can control the delivery of the second fluid 102a from the nozzle. The series of valves 232 can assist in the creation of certain mixtures of de-ionized water and slurry. The computer 150 responding to feedback from the sensors 140 can direct the fluid displacing device 210 and the fluid delivery device 230 in order to optimize planarization of the surface of the wafer 130 as described above in FIG. 8. Control over the series of valves 232 controlling the selection of the second fluid 102a from the ports 234, 236 and 238 can also directed by the computer 150.

Figure 10A:
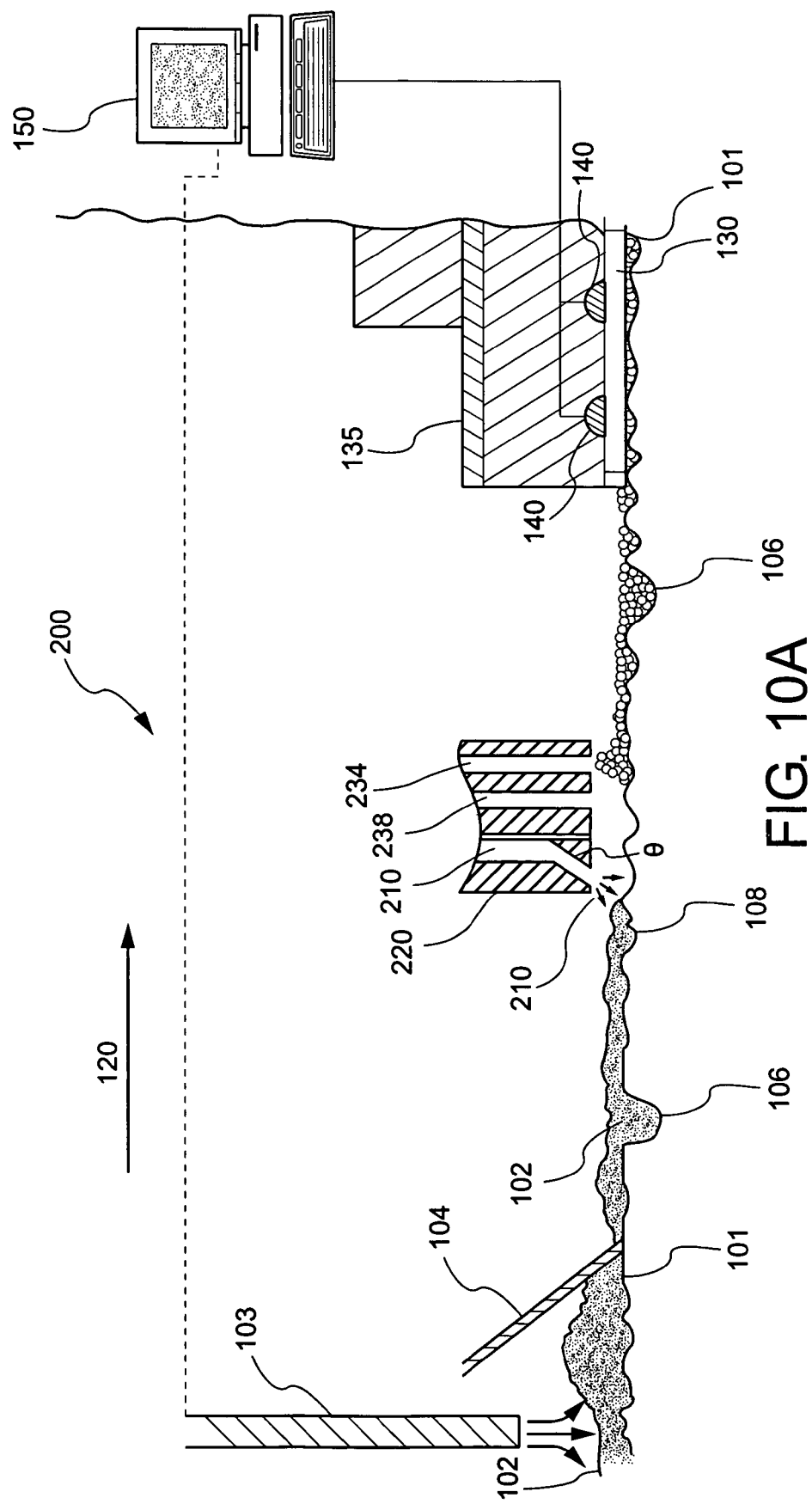
FIG. 10a provides another embodiment of a chemical mechanical planarization (CMP) system used for the differential closed loop planarization control, in accordance with the present invention.

FIG. 10a is yet another embodiment of the fluid displacing device 210, and the fluid delivery device 230 for use in the CMP system 200. In this embodiment, the fluid displacing device 210 and the fluid delivery device 230 are part of a head 220 capable of both displacing and replacing fluid on the polishing pad 101. The head 220 operates as an execution and correction system that receives commands from the computer 150 and performs an operation such as fluid displacement and replacement. The head 220 can have several channels configured to assist in the displacement and replacement of fluid on the polishing pad 101 before the wafer carrier 135. Alternatively, the head 220 can have the fluid displacing device 210, and the fluid delivery device 230 attached in a manner appropriate to ensure that the displacing and replacing affect a zone of an application area of the polishing pad 101.

The head 220 may be positioned above the polishing pad 101 from between about 0.1 mm and about 25 mm and will be optimized to provide the best controlled displacement of the fluid present on the polishing pad 101 downstream of the fluid restraining device 104. The exact optimal position will depend of the first fluid 102 dispensing rate, its viscosity, wetting coefficient, the advancing speed of the polishing pad 101 approaching the fluid displacing device 210. Other additional parameters may define the ability of the fluid displacing device 210 to provide a displacing fluid 212 to effectively clear the grooves 106, micropores 108, and surface of the polishing pad 101 of the first fluid 102 at a proximate location between the fluid restraining device 104 and the wafer carrier 135. In the arrangement with the head 220, the fluid displacing device 210 is integrated as the channel nearest and downstream of the fluid restraining device 104 and furthest upstream from the wafer carrier 135. The fluid displacing device 210 integrated as part of the head 220, provides a displacing fluid 212 at an angle θ which may be between about 10 degrees and up to about 90 degrees. A line perpendicular or normal to the polishing pad 101 may establish an appropriate reference for measurement of the angle θ. The angle θ for application of the displacing fluid 212 may be optimized so as to provide for optimal displacement of the first fluid 102 from the polishing pad 101. The displacing fluid 212 may be released through the fluid displacing device 210 by the use of a nozzle or other technique in order to provide about 5 to about 40 pounds per square inch (PSI) of fluid pressure.

Referring to FIG. 10*a*, the head 220 is configured to include ports 238 and 234 for delivery of the second fluid 102*a* in the manner of the fluid delivery device 230 discussed in FIGS. 8 and 9 above. Ports 238 and 234 can be configured to deliver slurry or variable abrasive-level slurry and de-ionized water, respectively. The displacement and replacement of fluid by the head 220 affects a zone, also referred to as a portion, of the polishing pad 101 between the fluid restraining device 104 and the wafer carrier 135. The computer 150 responding to feedback from the sensors 140 can direct the fluid displacing device 210 and the fluid delivery device 230 in order to optimize planarization of the surface of the wafer 130 affected by the zone as described above in FIG. 8.

Figure 10B:
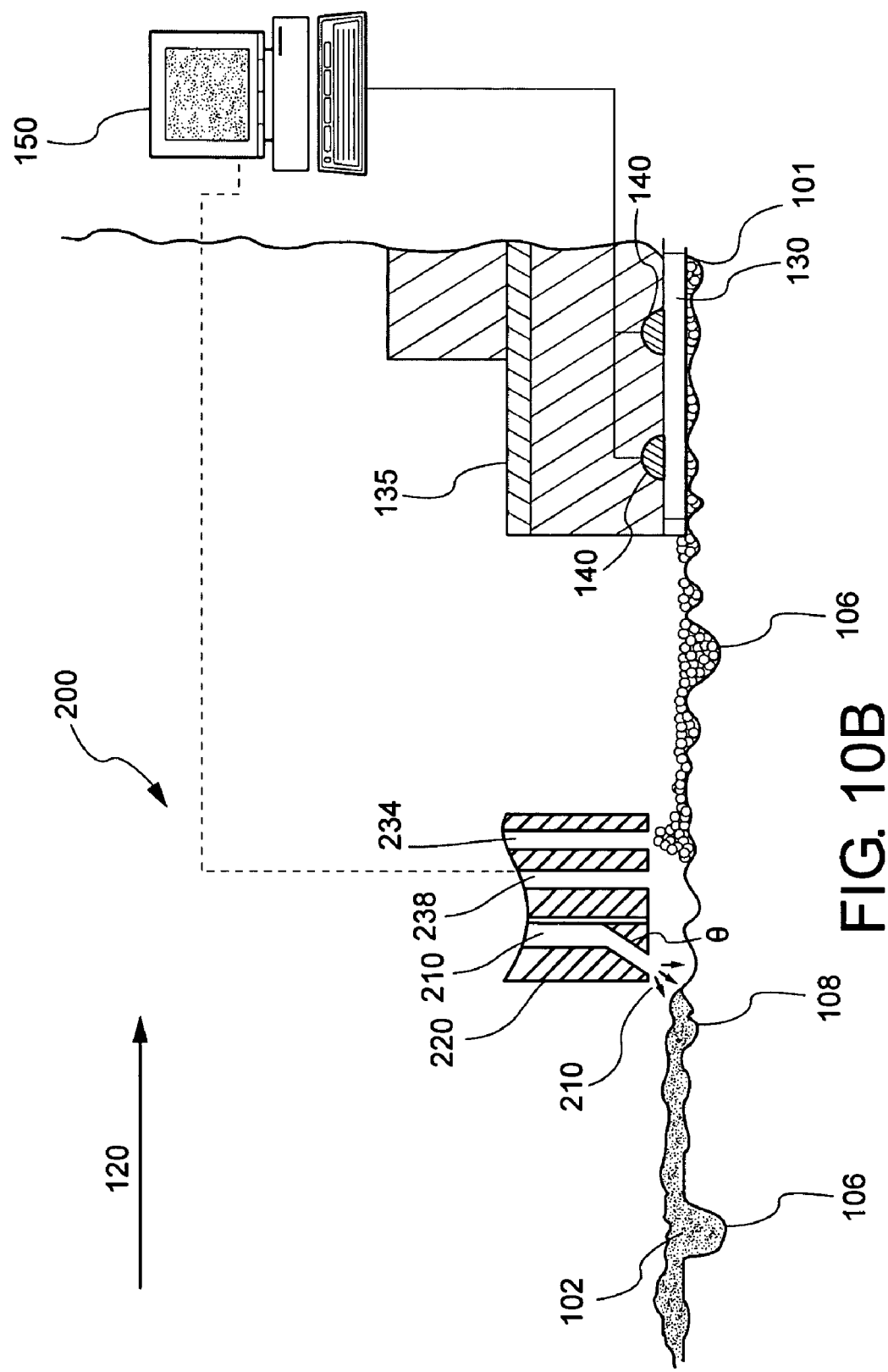
FIG. 10b provides an alternative embodiment of a chemical mechanical planarization (CMP) system used for the differential closed loop planarization control, in accordance with the present invention.

FIG. 10*b* provides a CMP system without a fluid delivery device 103 and a fluid restraining device 104. As shown in FIG. 10*b*, the head 220 having a fluid displacing device 210 and ports 238 and 234 can itself provide the fluid composition in a portion of the application area for the planarization of the wafer by the CMP system. Other arrangements of the fluid delivery device 230 used in conjunction with the fluid displacing device 210 such as those described in FIGS. 8–9 would be suitable as well. The displacement and replacement of fluid affected by the head 220 in an application area of the polishing pad 101 is sufficient for planarization to be achieved the corresponding position of the wafer 130 as the polishing pad travels in the direction 120.

Figure 11A:
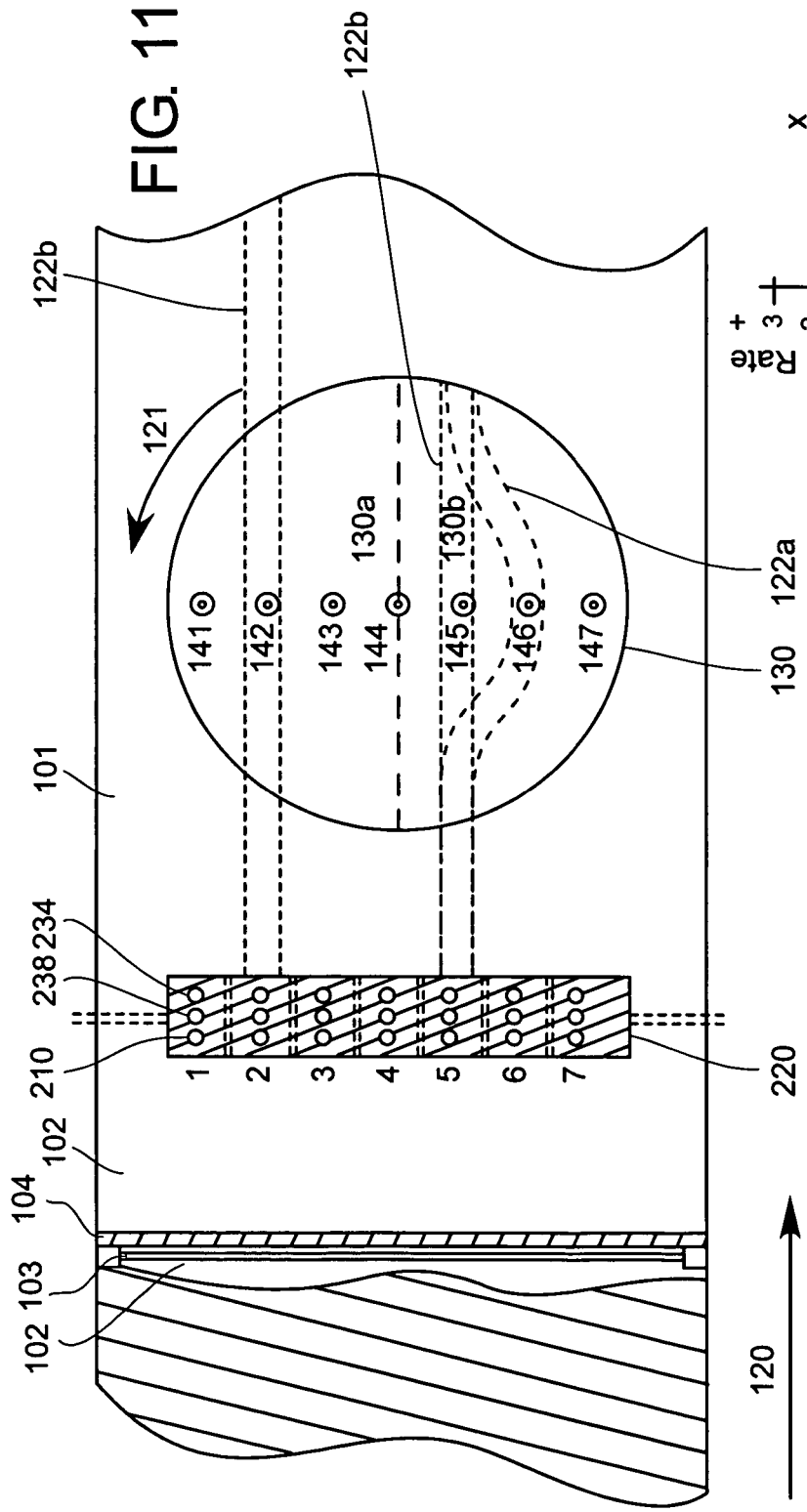
FIG. 11a is a top view diagram of a chemical mechanical planarization (CMP) system showing a head with several fluid displacement devices and ports for fluid delivery, in accordance with one embodiment of the present invention.

FIG. 11*a* provides a top view of the CMP system 200 described in FIGS. 8–10 above. It should be appreciated that the rotational velocity of wafer 130, along with the linear velocity of polishing pad 101, creates a situation where fluid directed at the center of wafer 130 is pushed off to the side due to the rotational velocity of the wafer 130. In that situation, e.g., where slurry is present on the polishing pad 101, the center of the wafer 130 experiences a lower removal rate due to a lesser amount of slurry being available at the center. The rotation of the wafer 130 provides for an alternative path 122 for excess fluids directed under the wafer carrier 135. The first fluid 102 or the second fluid 102*a* that is in the polishing pad 101 grooves 106 and micropores 108, as discussed above in FIG. 8, goes forward substantially linearly or in the direction 120 (for table types) forming a path 122*b* of the second fluid 102*a*. The fluid material on top of the polishing pad 101 can be shifted according to the rotation of the wafer carrier 135 in the path 122*a*. The second fluid 102*a* that is essentially in the material of the polishing pad 101 such that the portion within the grooves 106 and micropores 108 will proceed in a path 122*b* under the wafer carrier 135 even as the wafer carrier 135 is rotated. The path of fluids delivered on a linear belt will effect a circular application when applied to the wafer in rotation. In the case of rotary type CMP systems (discussed in FIG. 14*a* and 14*b* below) the direction 120 of the fluid in the grooves 106 and micropores 108 of the polishing pad 101 will affect a non linear path. A portion of the second fluid 102*a* on the polishing pad 101, that is excess fluid on the top of the surface of the polishing pad 101 and outside of the micropores 108 and grooves 106, may be partially displaced by the movement of the wafer carrier 135 as the polishing pad 101 advances in the direction 120.

Still referring to FIG. 11*a*, the fluid delivery device presented in FIGS. 8–9 as well as the ports 238 and 234 providing the second fluid 102*a* are also capable of being placed in a position according to the anticipated rotation of the wafer 130 in a direction 121. In the case of linear belt CMP systems, it should be appreciated that the belt is capable of moving in a linear direction 120 towards the wafer 130 while the wafer 130 is spinning about its axis. The high relative velocity section 130*a* of the polishing pad 101 is present where the polishing pad 101 and wafer 130 motion is opposite as shown in the top section of FIG. 11*a*. A low relative velocity section 130*b* is experienced where the rotation of the wafer 130 and polishing pad 101 move in the same relative direction. As a result, the polishing pad 101 tends to stain in the region experiencing the higher relative velocity, due to the greater amount of debris and process byproducts produced at the upper half of belt. Thus, one function of the fluid restraining device 104 and the pool of the first fluid 102 is to collect and distribute the debris more uniformly rather than having the debris recycle in the same general area of polishing pad 101. Uniform distribution of the debris may extend the life of the polishing pad 101 by promoting a more uniform wearing pattern, thus increasing process stability over multiple wafers.

The sensors 140 described above can be arrayed above the wafer 130 as shown by sensors 141–147. While the illustration provides for seven sensors, any suitable number of sensors providing material properties of the wafer could be used to provide feedback to the computer for the purpose of real-time control. Each sensor 140 being in the array of sensors 141–147 is configured to detect material properties of the wafer 130 as described above. The sensors 141–147 are correlated to a plurality of the head 220 spanning an application area of the polishing pad 101. The application area is defined by a plurality of zones spanning the area of the polishing pad 101 that will advance to a position directly beneath the wafer 130 as the polishing pad 101 proceeds in a direction 120 toward the sensors 141–147 arrayed above the wafer 130.

As shown in FIG. 11*a*, a head 220 having a plurality of the fluid displacing device 210, and the ports 238 and 234 configured to deliver slurry or variable abrasive-level slurry and de-ionized water, respectively may be configured to cover the application area. The head 220 downstream from the fluid restraining device 104 applies differential removal rates to portions of a surface of wafer 130 by displacement of the first fluid 102 and replacement with a second fluid 102*a* at a plurality of locations designated by the sensors 141–147. The head 220 is capable of providing the second fluid in a position according to the anticipated rotation of the wafer 130 in a direction 121.

The head 220 can be supported by an arm 114 or another suitable structures that provides for placement of the head 220 over the application area of the polishing pad 101. It should be appreciated by those skilled in the art that the fluid displacement and replacement can be affected at one or multiple locations. The locations of the heads 220 can be configured enabling isolation of specific zones on the surface of the polishing pad 101 in order to control the removal rate applied to wafer 130. A single head containing a plurality of displacing and replacing devices may used to cover the application area. Alternatively, a plurality of the heads 220 can be arrayed across the application area where each is capable of controlled linear movement in order to affect desired portions of the application area. A portion 1 of the head 220 through control the fluid displacing device 210, and the ports 238 and 234 of portion 1, affect a region of the wafer 130 monitored by the sensor 141. Similarly a portion 5 of the head 220 affects a portion of the application area associated with sensor 145. If the signal generated by any one of sensors 141–147 indicates that the removal rate is too high, i.e., the thickness is lower in a particular region of wafer 130 corresponding to one of the sensors 141–147, then the fluid displacing device 210 can be directed by the computer (as described above in FIG. 10a) to displace the first fluid 102 and the port 234 can deliver de-ionized water, or the port 238 can deliver a variable-level abrasive slurry in order to adjust the degree of planarization and reduce the removal rate experienced at the corresponding point on the wafer 130. Similarly, when a desired thickness on a portion of the wafer 130 has been obtained, the head 220, operating as an execution and correction system, displaces the first fluid 102 with and replaces the first fluid 102 with de-ionized water from the port 234 preventing further planarization in the affected area.

Figure 11B:
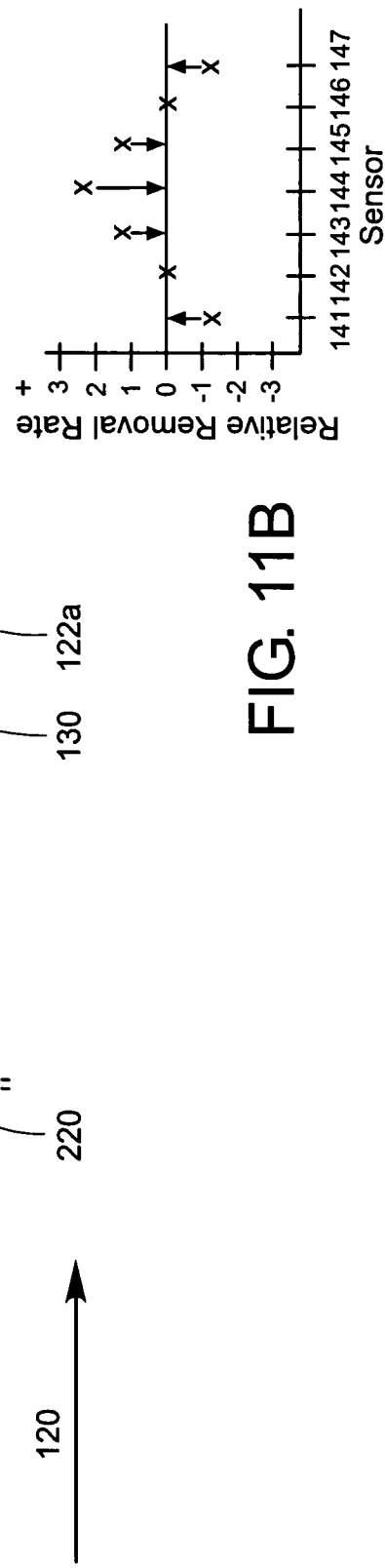
FIG. 11b provides a graph that demonstrates the control methodology used by the CMP system, in accordance with the present invention.

In FIG. 11b a graph is provided that demonstrates one exemplary control methodology used by the CMP system 200. On the x-axis the sensor array from the wafer carrier 135 is provided showing the sensors 141–147. As described in FIG. 11a above, the sensors 141–147 provide feedback relative to the polishing operation, otherwise known as the relative removal rate, correlated to zones of the application area. The relative removal rate of the polishing operation is provided on the y-axis. The target removal rate is shown as the median value with positive numbers 1, 2, and 3 showing a relative increase in the removal rate experienced at sensors on the x-axis. A value of negative 1 for the removal rate correlated to sensor 141 indicates that the value sensed is less that the target value for that particular sensor. If the removal rate value is lower than the target, then the fluid displacement device 210 described in FIGS. 8–9 above will displace the first fluid 102 on the polishing pad 101 and the fluid delivery device 230 will replace the first fluid 102 with slurry. Similarly a variable abrasive-level slurry could be added to increase the relative removal rate experienced at sensor 141.

In an alternative embodiment, such as the head 220 configuration described in FIG. 10a the displaced first fluid 102 on the polishing pad 101, will be replaced with a the second fluid 102a composed of slurry or variable abrasive-level slurry in order to increase the relative removal rate sensed at sensor 141. Should a sensor, such as sensor 144 indicate a higher removal rate than the target value, displacement of the first fluid 102 and replacement with de-ionized water will drive the relative removal rate experienced at sensor 144 lower in the direction of the target value. Fluid displacing devices 201 and fluid delivery devices 230 associated with the various zones spanning the application area can work independently or dynamically in order to optimize the relative removal rate to affect a target thickness of material polished by the CMP system.

Figure 12:
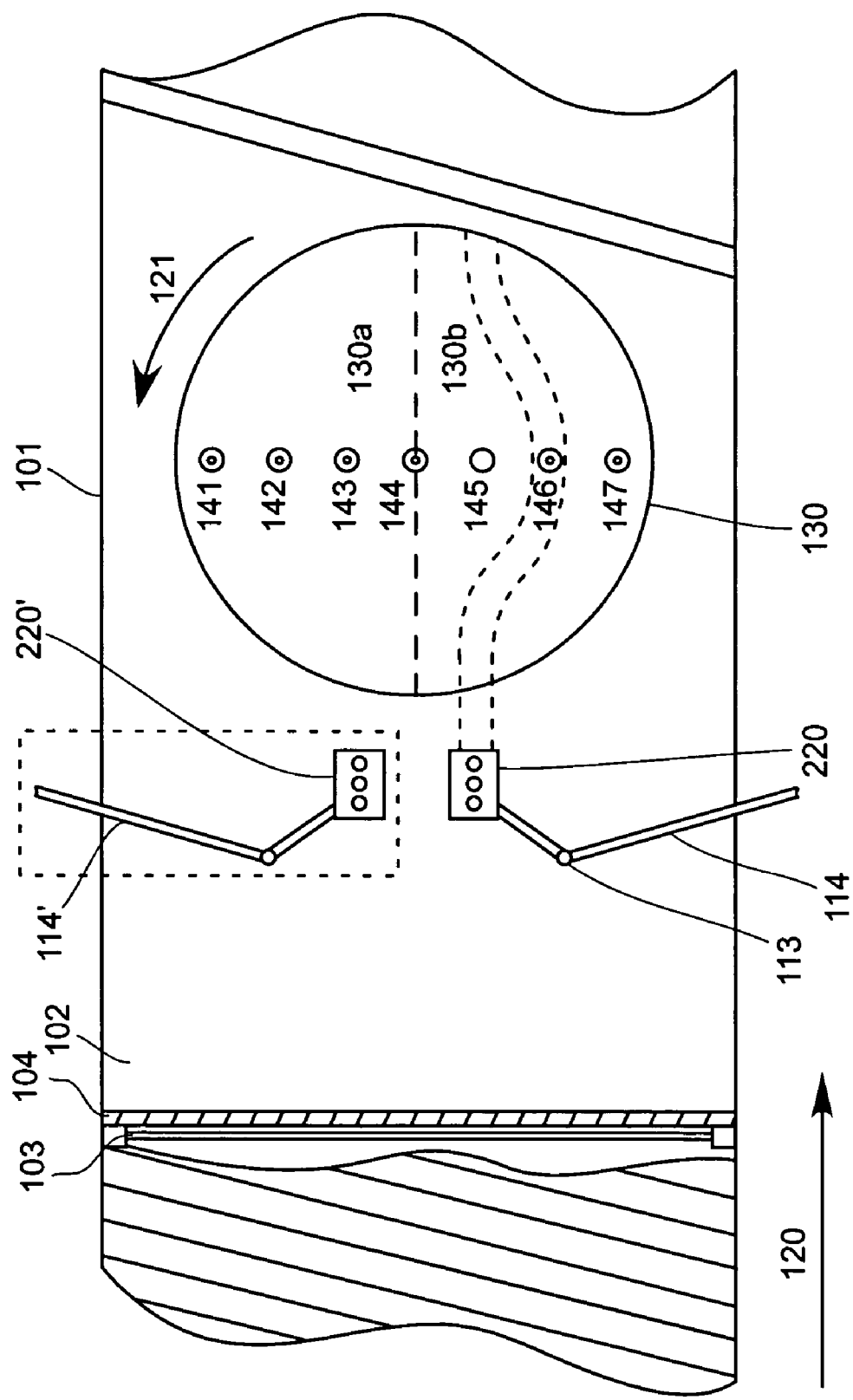
FIG. 12 is a top view diagram of a chemical mechanical planarization (CMP) system showing a head that can be moved by an extending arm, in accordance with one embodiment of the present invention.

FIG. 12 is an alternative embodiment of the CMP system described in FIGS. 8–11. An arm 114 provides support for a head 220 containing a fluid displacing device 210 and ports 238 and 234 configured to deliver slurry or variable abrasive-level slurry and de-ionized water, respectively. The arm 114 could move the head 220 to locations designated by the sensors 141–147. The arm 114 may have several joints 113 and may be controlled by any suitable technique such as a step motor, servo motor, etc., in order to displacement of the first fluid 102 and replacement with the second fluid 102a on the surface of polishing pad 101 downstream from fluid restraining device 104, in order to control the removal rate applied to wafer 130. Additionally, a plurality of arms 114' could move a plurality of heads 220' to locations designated by the computer 150 in order to provide displacement and replacement of fluids comprising a film on the application area of the polishing pad 101 as described in FIG. 11. A plurality of arms 114' configured to support fluid displacing devices 210 and ports 238 and 234 responsible for delivering a replacement fluid to the polishing pad 101, as described above, can be employed by the CMP system to differentially control the removal rate to ensure a target thickness of material remaining on the surface of the wafer 130.

Figure 13:
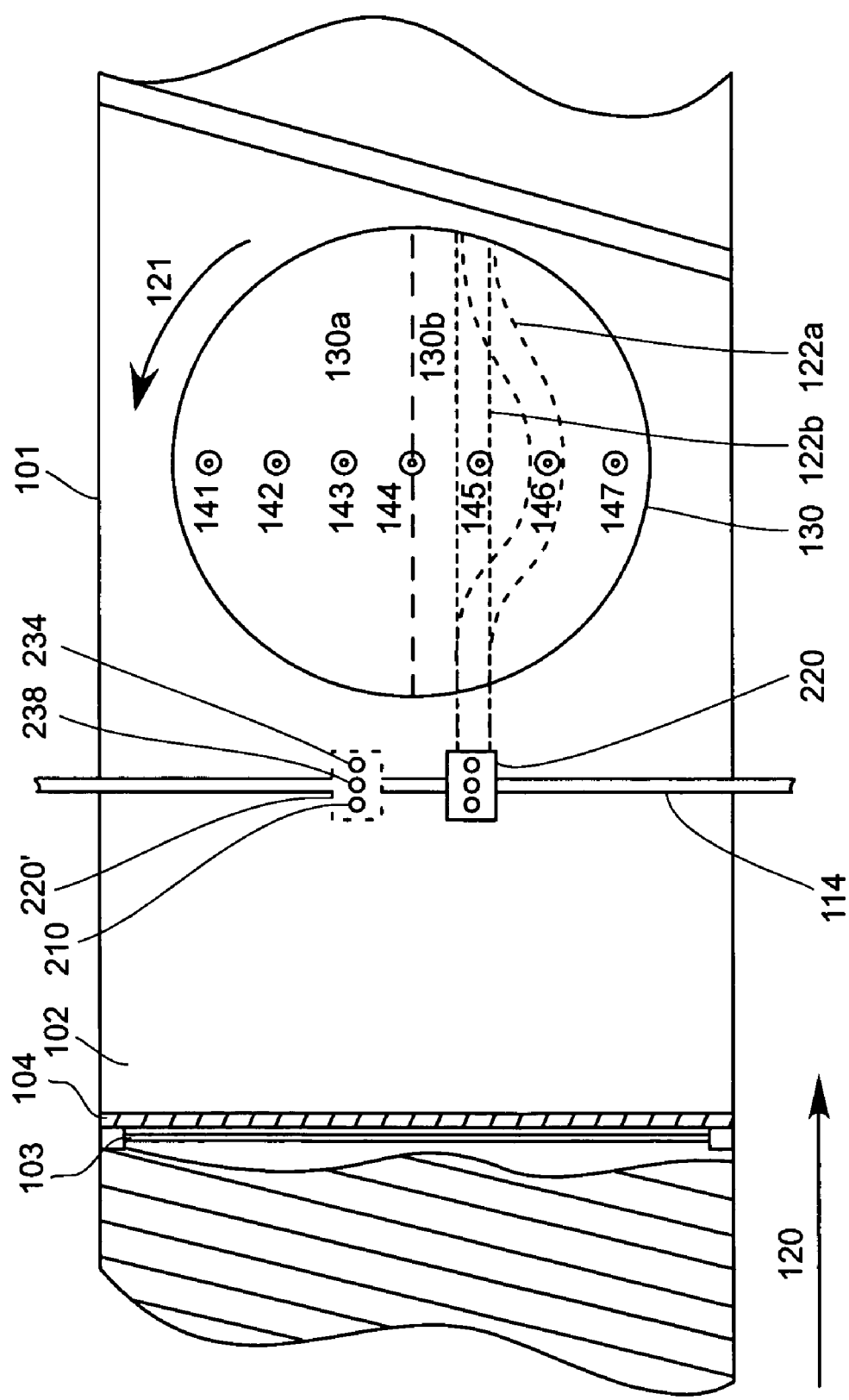
FIG. 13 is a top view of a chemical mechanical planarization (CMP) system showing a head with fluid displacement devices and ports for fluid delivery that can slide on an arm, in accordance with one embodiment of the present invention.

FIG. 13 provides an alternative arrangement of the head 220 configured on the arm 114. The head 220 could move linearly along an arm 114 that extends across the width of polishing pad 101 as illustrated in FIG. 13. The location of the head 220 can enable isolation of specific regions on the surface of the polishing pad 101 under the fluid displacing device 210 and the ports 238 and 234 configured to deliver slurry or variable abrasive-level slurry and de-ionized water, respectively in order to control the removal rate applied to wafer 130. A plurality of heads 220' may be optional for improved coverage of the application area, that is the area of the polishing pad 101 that will pass below the surface of the wafer 130. The head 220 and the heads 220' could move linearly in concert or independently along an arm 114 that extends across the width of polishing pad 101. The computer 150, described in FIG. 8 above, is capable of providing orchestration of the movement of head 220 or heads 220' in order to properly prepare the polishing pad 101 for the differentially controlled planarization operation.

Figure 14A:
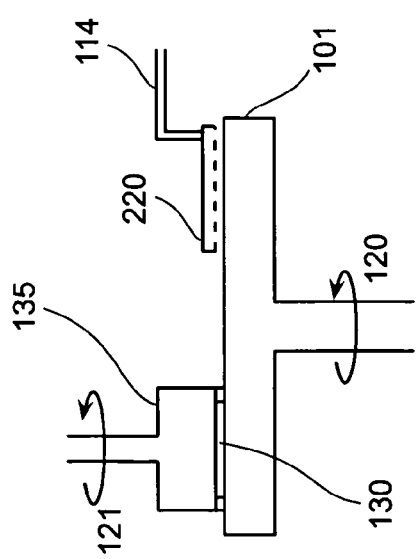
FIG. 14a is side view of an alternate configuration of the invention in a rotary format, in accordance with one embodiment of the present invention.

FIG. 14a is side view of an alternate configuration of the CMP system described in FIGS. 8–10 and FIGS. 11a–11b above. A wafer carrier 135 may be configured to position a wafer 130 over a polishing pad 101 on a rotary platform. The head 220 provides for the displacement and replacement of fluids present on the polishing pad 101 controlling the relative removal rate of material on the surface of the wafer 130.

Figure 14B:
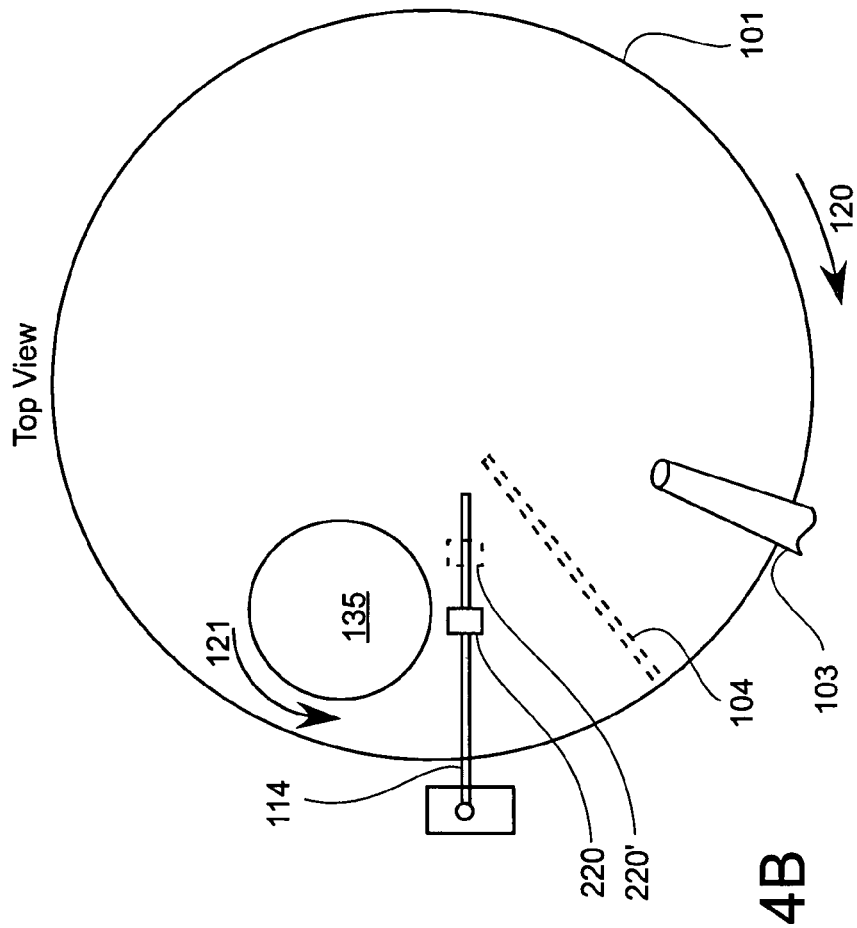
FIG. 14b is top view of the present invention employed in a rotary type system, in accordance with one embodiment of the present invention.

FIG. 14b is top view of a rotary type configuration CMP system utilizing displacement and replacement of fluids composing the film on the polishing pad 101. An arm 114 supports a head 220 over a rotating polishing pad 101 upstream of a wafer carrier 135 and downstream of a fluid delivery device 103 and a fluid restraining device 104. The head 220 is complete with a fluid displacement device 210 providing displacement of a first fluid 102 on a polishing pad 101 and ports 238 and 234 which provide replacement of the first fluid 102 with a second fluid 102a as described in the figures above.

Figure 15:
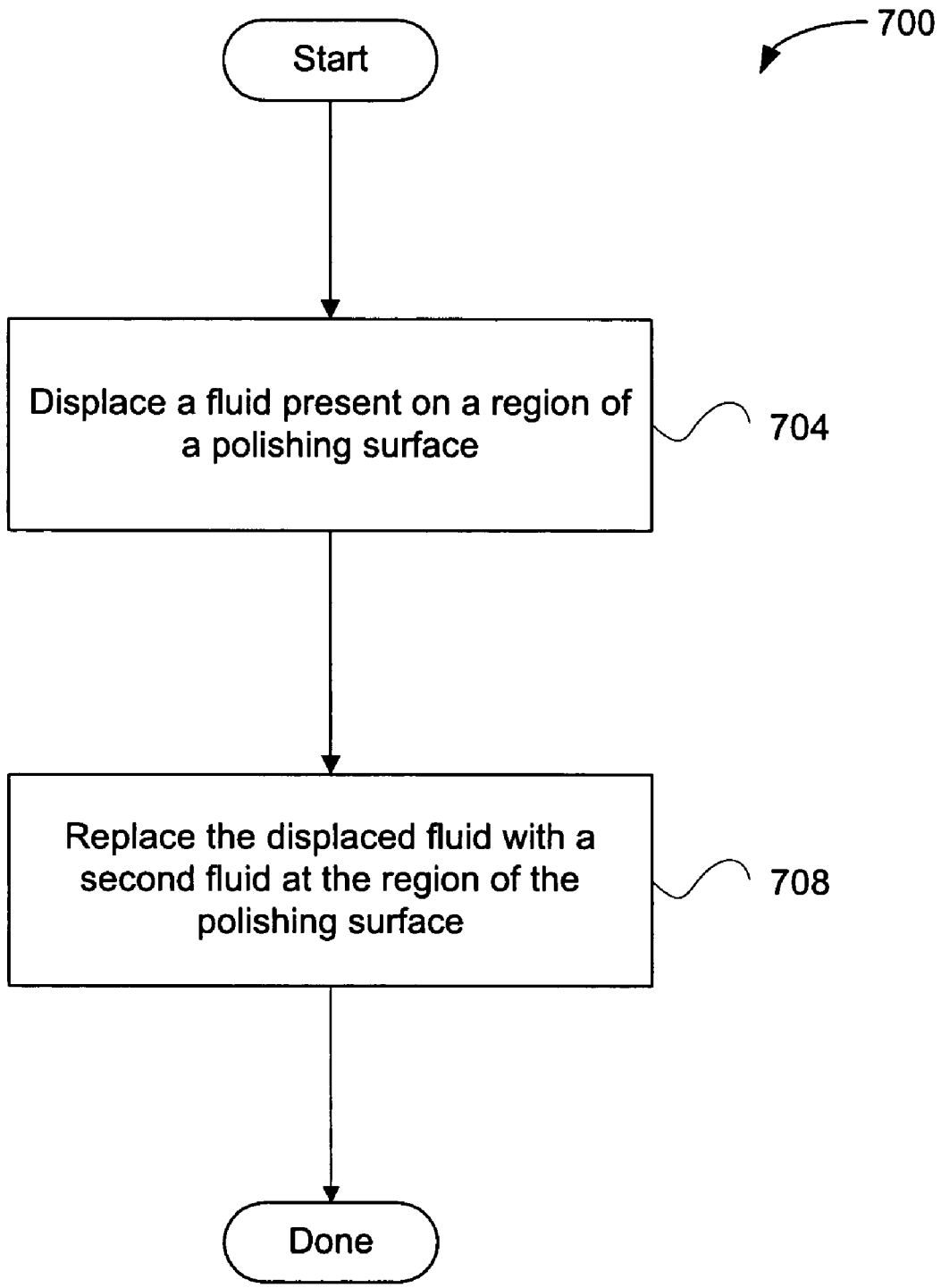
FIG. 15 is a flow chart of a method for controlling properties of a film over a polishing pad surface through the displacement and replacement of fluids on the polishing surface.

FIG. 15 is flow chart diagram that provides a method of controlling properties of a film present over a polishing pad. The method begins by displacing a fluid present on a region of a polishing surface in operation 704. The fluid material composition of the film on and in the polishing pad may vary depending on the polishing operation. The fluid displaced which composes the film on and in a region of the polishing pad may include slurry, an amount of de-ionized water, chemicals, isopropyl alcohol, particulates, abrasives, material residues, and pad residues. In operation 708 the displaced fluid is replaced with a second fluid at the region of the polishing surface. The second fluid may be one or a combination of slurry, variable abrasive-level slurry, slurry and de-ionized water. The second fluid as a film on and in the surface of the polishing pad assists in the polishing operation by effecting a region of a wafer located downstream. The method of displacement and replacement of fluids can be applied to all types of CMP apparatuses as it controls the material composition of the film that assists in the planarization process and therefore is not limited to linear or rotary systems.

Figure 16:
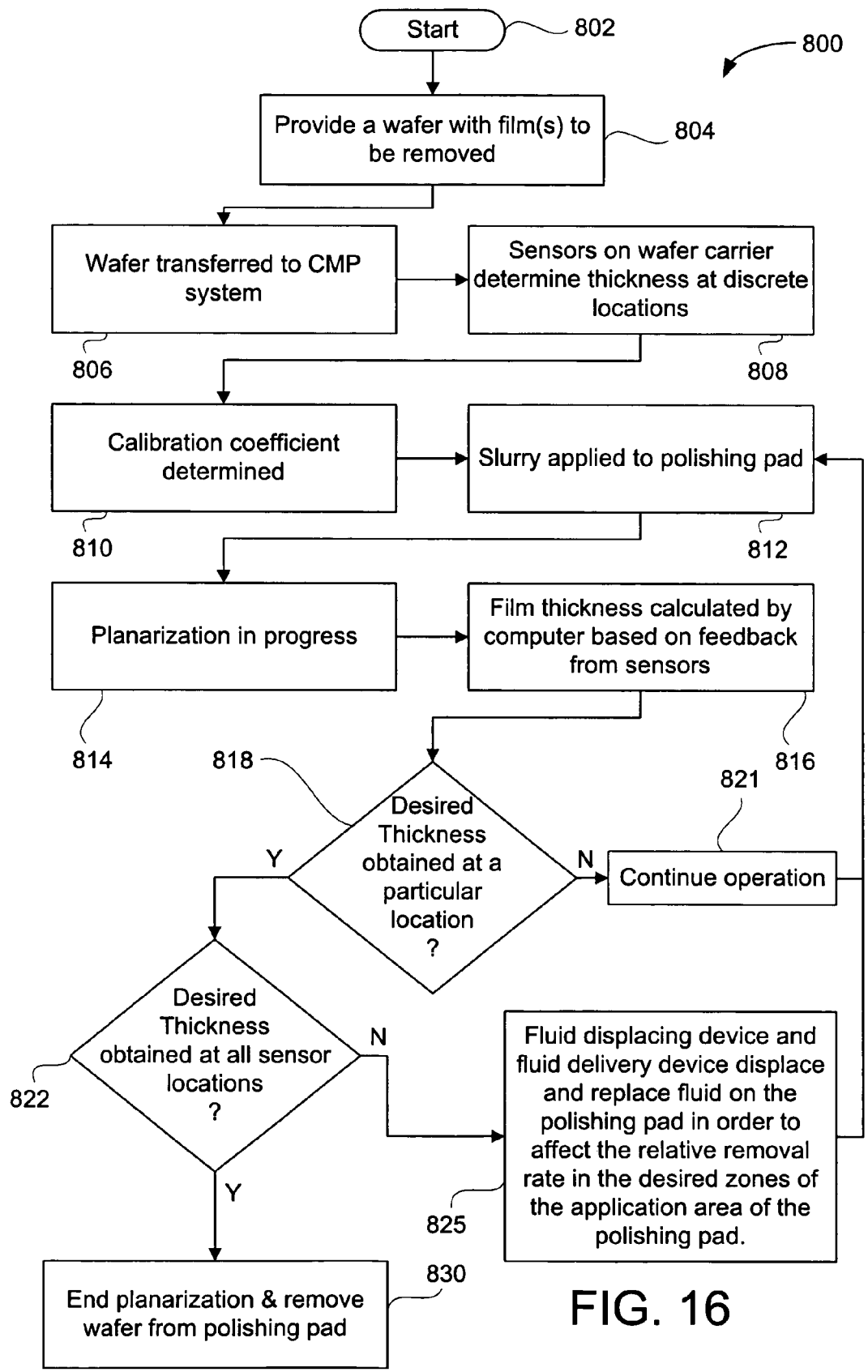
FIG. 16 is flow chart for an operational method of a chemical mechanical planarization system providing differential control for removal rates applied to a substrate surface through displacement and replacement of fluids on the surface of a polishing pad, in accordance with one embodiment of the present invention.

FIG. 16 is a flow chart diagram illustrating an operational method for controlling properties of a film present over a polishing surface in accordance with one embodiment of the invention. The method begins when a wafer is provided for the purpose of having a film or films removed in operation 804. A thickness map of the substrate could be generated prior to a processing operation. The thickness map may be generated as the surface of a wafer is scanned to obtain thickness data in the absence of external inductive objects, or third bodies. Here, an aligner and other transfer stations may be used to scan the surface of the wafer in order to create a thickness map as described above. Third bodies, i.e., conductive objects are not present here as only the wafer and the scanning mechanism is used to create the thickness map. A substrate component of the thickness data and a film component of the thickness data is identified. Here, the signal generated by scanning the surface of the wafer is subdivided into the substrate component and a film component. For example, an inductive signal may be broken down into the two components. It should be appreciated that from this component data, calibration coefficients may be generated which may be subsequently applied to a downstream measurement of the thickness, i.e., a sensor embedded in a wafer carrier, in order to more precisely determine the thickness.

The method then proceeds to operation 806 where the wafer is transferred to a processing station. In one embodiment, the processing station is a CMP system. Of course, any suitable robotic, mechanical, or manual technique may be used to transfer the wafer to the processing station. The method then moves to operation 808 where sensors on the wafer carrier determine film thickness corresponding to discrete points on the wafer and the presence of external inductive objects, or third bodies is detected. Here, one or more sensors embedded in the wafer carrier as described above with reference to FIGS. 8–13 may be used to detect the thickness data. In one embodiment, an inductive sensor is used for this detection, however scatterometers, spectral reflectometry, thermal monitoring, stress monitoring, and other sensors could be employed.

Next in operation 810, thickness data corresponding to the point on the wafer is adjusted to substantially eliminate both the substrate component and the third body effects. That is, the calibration coefficient determined in the absence of third bodies is used to isolate the thickness data related to the film on the wafer described above. A coordinate of the thickness map is associated with a sensor (eg. inductive sensor described above) utilized in the processing operation. A point on the thickness map may be associated with a sensor embedded in the wafer carrier so that the planarization process may be controlled in the region associated with the sensor embedded in the wafer carrier. A computer, also known as a controller, as described in FIG. 8 above may provide the calculations necessary to make this association. When slurry is applied to the pad in operation 812, planarization of the wafer surface begins in operation 814. Film thickness at discrete locations is calculated by the computer receiving feedback from the sensors 816 monitoring the affect of film from the zone on a wafer being planarized as described above. Until desired thickness is obtained at a particular location in operation 818, the planarization process continues per operation 821. If the desired thickness is obtained at a particular location a query of all sensor locations is made in operation 822.

If desired thickness is obtained at some but not all locations, a fluid displacing device and fluid delivery device displace and replace fluid composing a film on the polishing pad in order to affect the relative removal rate in the desired zones of the application area of the polishing pad in operation 825 as described in FIGS. 8–14 above. An array of the zones of displacing and replacing are arranged across an application area of the polishing pad surface. The computer is capable of adjusting the displacing and replacing at the zones based on feedback from sensors correlated to areas affected by the properties of the film. If a system is not equipped with a computer or if manual control is desired the displacing and replacing zones can be positioned and adjusted by hand or other mechanical technique based on pre-planarization analysis and or wafer mapping. Pre-calibration of the system may be accomplished so that feedback from the sensors is not as important or critical in the positioning and real-time control of the displacing and replacing operation.

In order to achieve a target thickness of material polished by the polishing pad surface, the computer sets a degree of the adjusting of the displacing and replacing at differential rates in the zones based on feedback from the sensors. In zones having desired thickness or excessive removal rates the fluid displacing device displaces a first fluid composed primarily of slurry from the polishing pad and replaces the first fluid with a second chemically inert non-abrasive fluid, namely de-ionized water. Alternatively, removal rates may be increased in desired areas by displacement of the first fluid and replacement with a slurry or a variable abrasive-level slurry in operation 825.

The method then continues to apply slurry to the polishing pad in operation 812 while areas designated by the computer as having obtained the desired thickness have the second fluid composed of de-ionized water substituted for slurry. Operation 812 continues until sensors at all locations indicate that the desired thickness has been obtained in operation 822. When desired thickness has been obtained at all positions on the wafer, the planarization process is complete and the wafer is removed from the polishing pad in operation 830.

In summary, the embodiments of the present invention provide for a CMP system that is capable of being configured to differentially control removal rates being applied to regions of a wafer. Differential control enables a uniform thickness to be obtained as opposed to a uniform removal rate. Through the use of a fluid restraining device that creates a pool, a uniform slurry layer is defined downstream of the restraining device. A fluid displacing device provides process control by displacing a first fluid composed of one or a combination of slurry, particulates, abrasives, isopropyl alcohol and water at designated locations in and on a polishing pad. A fluid delivery device, which may include one or more ports for fluid delivery, is capable of replacing the displaced first fluid with de-ionized water, slurry or a variable abrasive-level slurry in a zone of the polishing pad. The fluid displacing device and fluid delivery device displace and replace fluid composing a film on the polishing pad in order to affect the relative removal rate in the desired zones of the application area of the polishing pad. Sensors on the wafer carrier capable of detecting material properties of the wafer being polished provide feedback to the fluid displacing device and fluid delivery device in order to adjust the degree of planarization and reduce the removal rate experienced at the corresponding point on wafer. When a desired thickness on a portion of the wafer has been obtained, the fluid displacing device and the fluid delivery device, which may be part of a head, displace the first fluid and replace the first fluid with de-ionized water preventing further planarization or significantly reducing planarization in the affected area.

After a desired thickness is detected uniformly about the wafer, the planarization operation is complete and a signal may be issued to stop the operation. The plurality of sensors described above allow for the determination of the endpoint and associated removal rates by initially determining a thickness of a film on the wafer under non-process conditions and also during the planarization process. The above described embodiments may be applied to rotary or orbital type CMP systems as well as linear CMP systems that rely upon belt type polishing media.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

The invention claimed is:

1. A system for processing semiconductor substrates comprising:
   a polishing pad;
   a wafer carrier, the wafer carrier capable of being positioned at a proximate location over a polishing pad, the wafer carrier configured to receive a wafer;
   a first fluid capable of being placed on the polishing pad, the fluid assisting in a planarization of the wafer held by the wafer carrier;
   a fluid restraining device capable of controllably distributing the first fluid across the polishing pad;
   a fluid displacing device capable of being positioned at a proximate location over the polishing pad between the fluid restraining device and the carrier head, the fluid displacing device capable of displacing the first fluid from a region on the polishing pad;
   a fluid delivery device capable of replacing the first fluid with a second fluid at the region of the polishing pad, the second fluid being different than the first fluid;
   a computer; and
   a sensor capable of being positioned on the wafer carrier.

2. The system of claim 1, wherein the first fluid may be one or a combination of slurry, de-ionized water, isopropyl alcohol, particulates, abrasives, material residues and pad residues.

3. The system of claim 1, wherein the fluid displacing device provides one of air, clean dry air, and nitrogen to displace the first fluid from a region of the polishing pad.

4. The system of claim 1, wherein the proximate location of the fluid displacing device over the polishing pad is between about 0.1 mm and about 25 mm.

5. The system of claim 1, wherein the fluid displacing device is capable of providing between about 5 to about 40 pounds per square inch (PSI) of fluid pressure.

6. The system of claim 1, wherein the fluid displacing device is offset from the polishing pad by an angle between about 10 degrees and 90 degrees.

7. The system of claim 1, wherein the fluid delivered by the fluid delivery device may be one or a combination of de-ionized water, slurry, and a variable abrasive-level slurry.

8. The system of claim 7, wherein selection of one of de-ionized water, slurry, and a variable abrasive-level slurry adjusts a degree of planarization by the CMP system.

9. The system of claim 8, wherein the displacing fluid device and the fluid delivery device affect a zone of the polishing surface.

10. The system of claim 9, further comprising,
    a plurality zones defined by at least two of the zone to span an application area of the polishing surface.

11. The system of claim 9, wherein the displacing fluid device and the fluid delivery device affecting the zone are part of a head.

12. The system of claim 11, wherein a plurality of the heads defined by two or more of the head is configured to span the application area of the polishing surface.

13. The system of claim 11, wherein the head is connected to an arm.

14. The system of claim 1, wherein the computer is capable of communication with the sensor.

15. The system of claim 1, wherein the sensor is capable of detecting material properties of a substrate.

16. The system of claim 15, wherein the material properties include one or more of film thickness, conductivity, surface roughness, and topography height variations.

17. The system of claim 15, wherein the sensor is an inductive sensor.

18. The system of claim 1, wherein the computer is capable of providing control over operation of the fluid displacing device and the fluid delivery device.

19. A method of controlling properties of a film present over a polishing pad surface, comprising:
    displacing a fluid present on a region of a polishing surface;
    replacing of the displaced fluid with a second fluid at the region of the polishing surface, the replacing at the region occurring after the displacing so that the second fluid occupies the region previously occupied by the displaced fluid, further comprising,
    monitoring an affect of the film from zones on a wafer being planarized;
    receiving feedback from sensors correlated to affected planarization of substrates relative to the zones; and
    adjusting the displacing and replacing at a zone based on feedback received from the sensors correlated to areas affected by properties of the film.

20. The method of controlling properties of a film present over a polishing pad surface, as recited in claim 19, wherein the displacing and the replacing is configured to control properties of the film which provide for varying the degree of planarization.

21. The method of controlling properties of a film present over a polishing pad surface, as recited in claim 19, wherein the second fluid is one or a combination of de-ionized water, slurry, and a variable abrasive-level slurry.

22. The method of controlling properties of a film present over a polishing pad surface, as recited in claim 19, further comprising,
    arranging an array of the zones of displacing and replacing across an application area of the polishing pad surface.

23. The method of controlling properties of a film present over a polishing pad surface, as recited in claim 22, further comprising:
    setting a degree of the adjusting of the displacing and replacing at differential rates in the zones based on feedback from sensors to achieve a target thickness of material polished by the polishing pad surface.

* * * * *